US011456181B2

(12) United States Patent
Cheng et al.

(10) Patent No.: US 11,456,181 B2
(45) Date of Patent: Sep. 27, 2022

(54) CROSS-BAR FIN FORMATION

(71) Applicant: International Business Machines Corporation, Armonk, NY (US)

(72) Inventors: Kangguo Cheng, Schenectady, NY (US); Chanro Park, Clifton Park, NY (US); Ruilong Xie, Niskayuna, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/923,501

(22) Filed: Jul. 8, 2020

(65) Prior Publication Data
US 2022/0013366 A1 Jan. 13, 2022

(51) Int. Cl.
*H01L 21/308* (2006.01)
*H01L 29/78* (2006.01)
*H01L 21/3065* (2006.01)
*H01L 21/3213* (2006.01)
*H01L 21/306* (2006.01)

(52) U.S. Cl.
CPC ...... *H01L 21/3086* (2013.01); *H01L 21/3065* (2013.01); *H01L 21/3081* (2013.01); *H01L 21/30604* (2013.01); *H01L 21/32137* (2013.01); *H01L 21/32139* (2013.01); *H01L 29/7827* (2013.01)

(58) Field of Classification Search
CPC .......... H01L 21/3086; H01L 21/30604; H01L 21/3065; H01L 21/3081; H01L 21/32137; H01L 21/32139; H01L 29/7827
See application file for complete search history.

(56) References Cited

U.S. PATENT DOCUMENTS

| | | | |
|---|---|---|---|
| 8,956,932 B2 | 2/2015 | Cheng | |
| 9,391,073 B2 | 7/2016 | Yin | |
| 9,496,259 B2 | 11/2016 | Chien | |
| 9,570,288 B2 | 2/2017 | Rigante | |
| 9,748,244 B2 | 8/2017 | Masuoka | |
| 9,799,765 B1 | 10/2017 | Bergendahl | |
| 10,134,915 B2 | 11/2018 | Colinge | |
| 10,340,364 B2 | 7/2019 | Zhang | |
| 10,418,484 B1 | 9/2019 | Xie | |
| 2017/0194436 A1* | 7/2017 | Basker | H01L 21/845 |
| 2018/0005902 A1 | 1/2018 | Anderson | |
| 2018/0090579 A1 | 3/2018 | Cheng | |
| 2018/0374837 A1* | 12/2018 | Lazzarino | H01L 21/76816 |
| 2019/0148516 A1* | 5/2019 | Zhang | H01L 29/66666 257/329 |
| 2019/0181238 A1 | 6/2019 | Wang | |
| 2020/0227306 A1* | 7/2020 | Cheng | H01L 29/66795 |

* cited by examiner

*Primary Examiner* — Duy Vu N Deo
(74) *Attorney, Agent, or Firm* — Alexander G. Jochym

(57) ABSTRACT

A first mask layer is formed on top of a semiconductor substrate. A mandrel material is formed perpendicular to the first mask layer. A second mask layer is formed on one or more exposed surfaces of the mandrel material. The mandrel material is removed. A pattern of the first mask layer and the second mask layer is transferred into the semiconductor substrate.

7 Claims, 35 Drawing Sheets

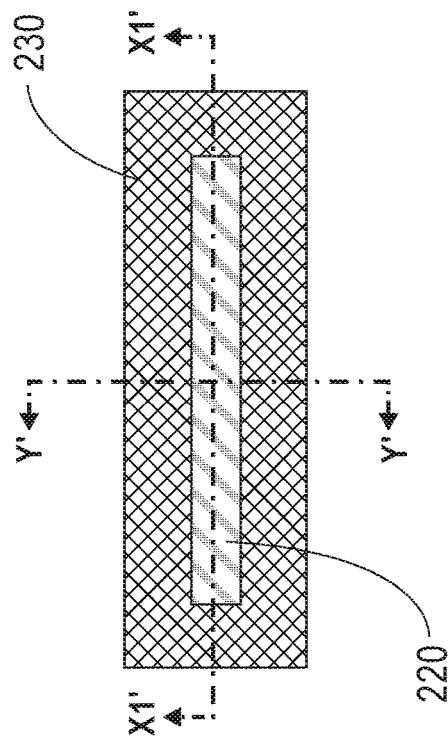
FIG. 12A
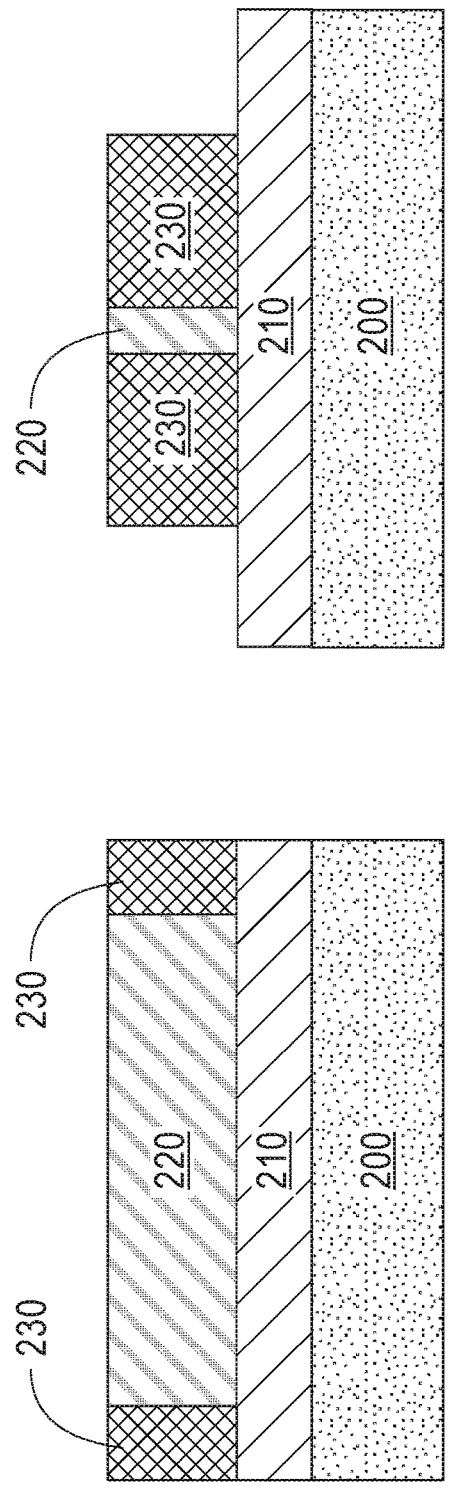
FIG. 12C
FIG. 12B

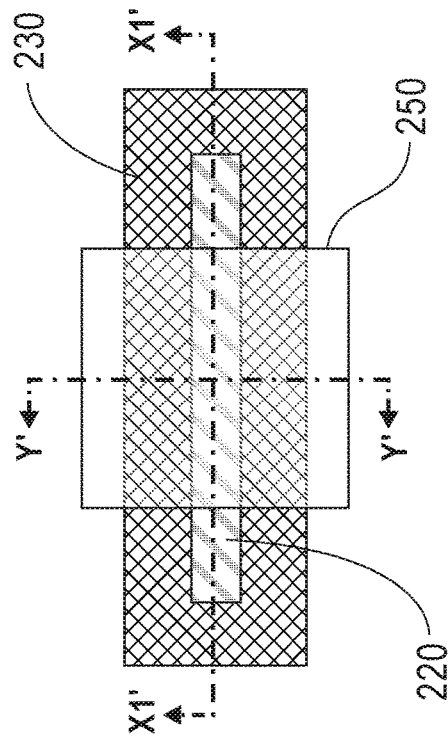
FIG. 13A
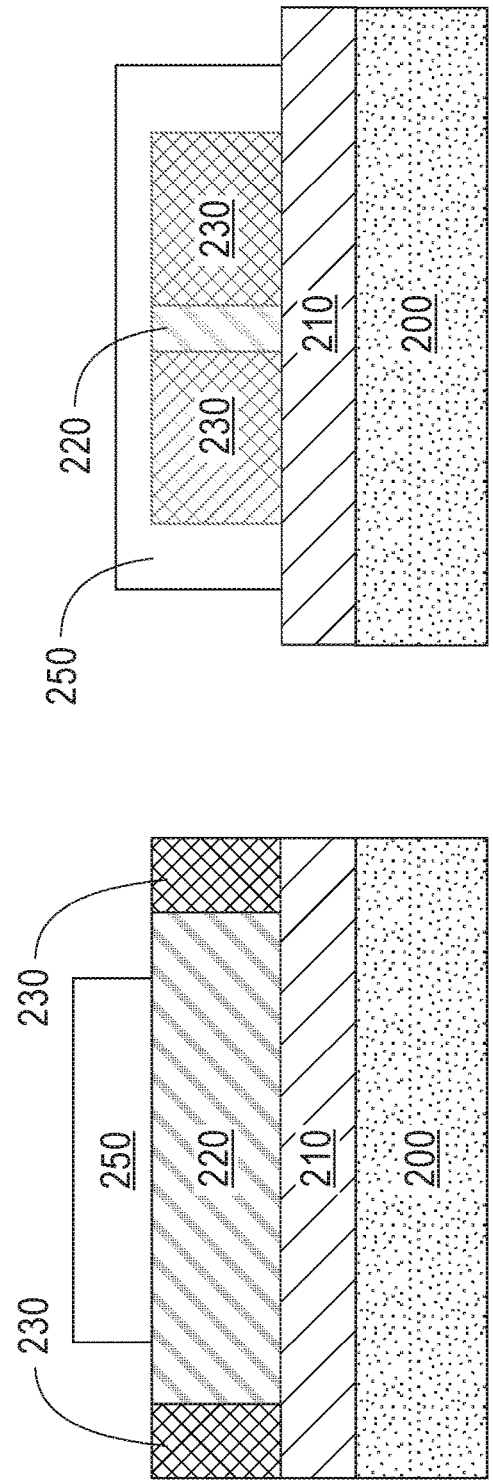
FIG. 13C
FIG. 13B

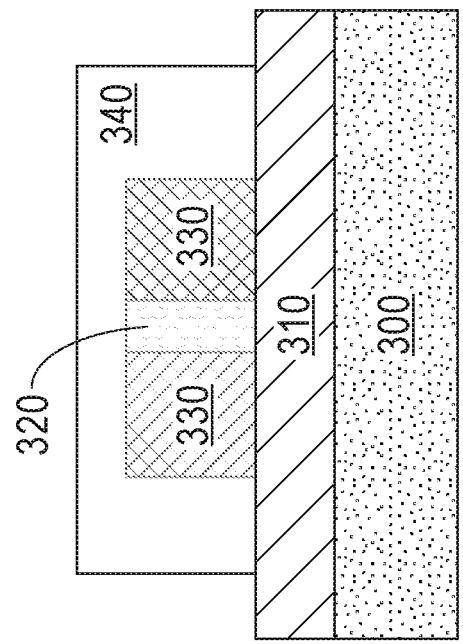
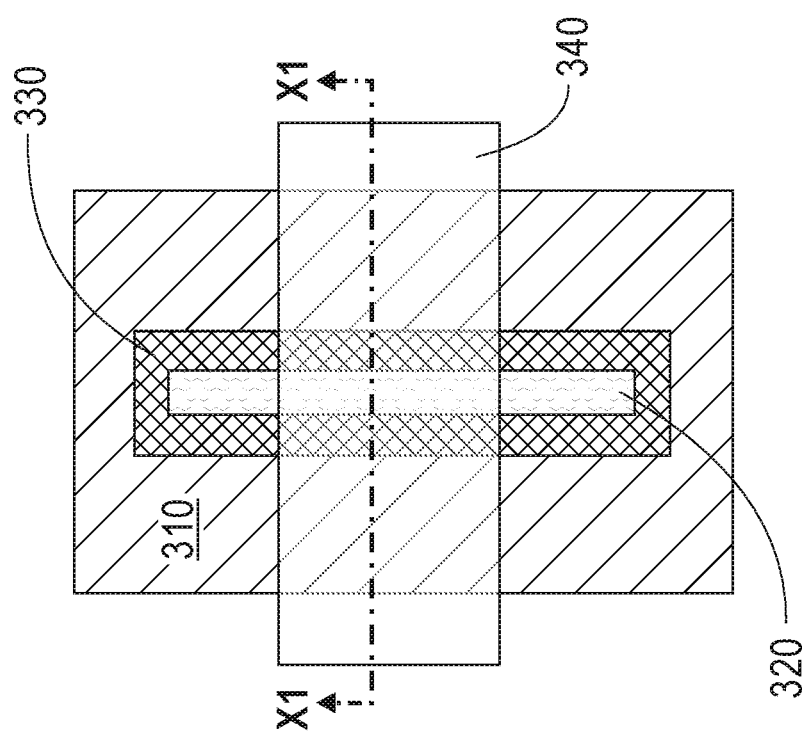
FIG. 26B
FIG. 26A

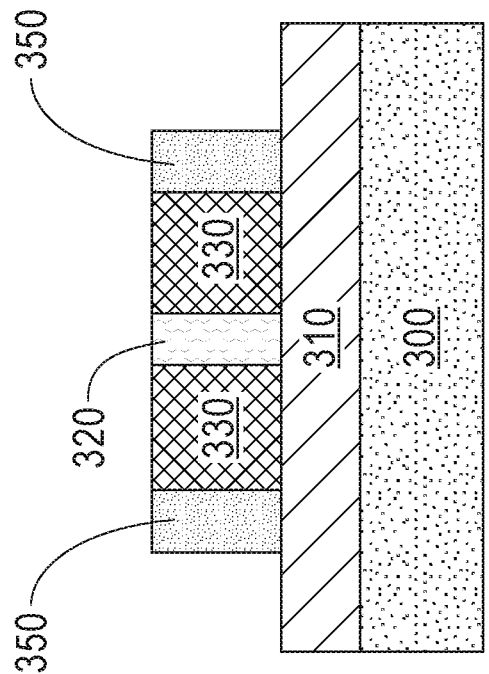
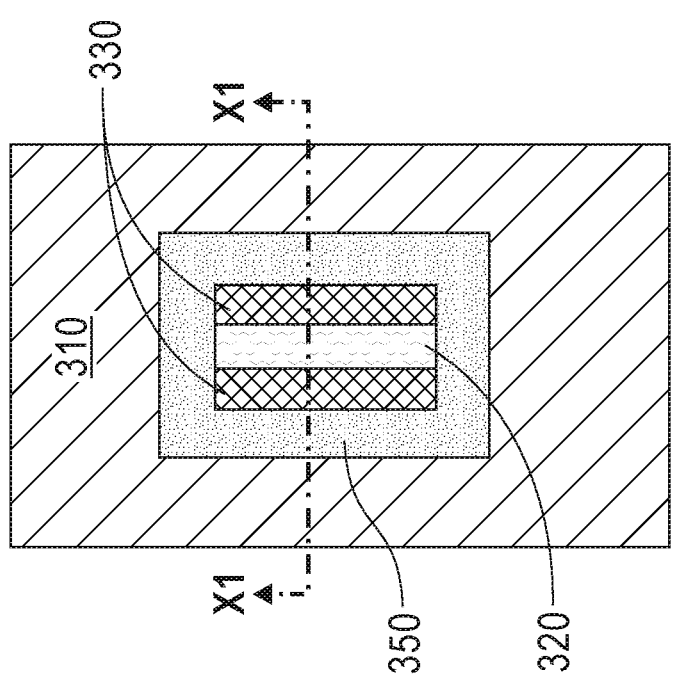
FIG. 29A
FIG. 29B

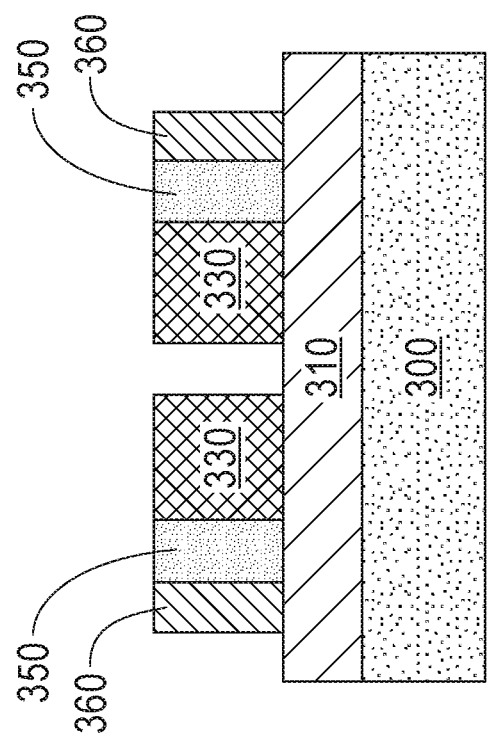
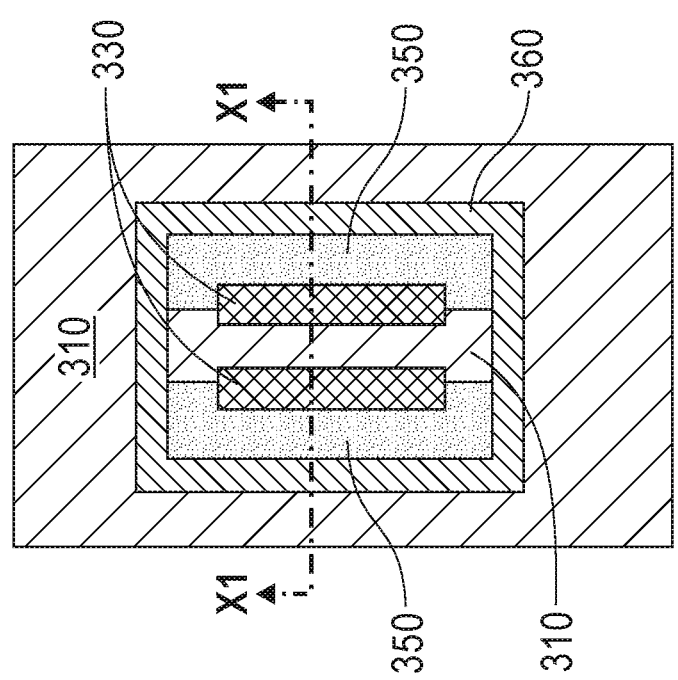
FIG. 32A
FIG. 32B

CROSS-BAR FIN FORMATION

BACKGROUND OF THE INVENTION

The present invention relates generally to the field of vertical transport field effect transistors (VTFET) and more particularly to the formation of cross bar fins for VTFET.

Metal oxide semiconductor field-effect transistors (MOSFETs) are essential for building electronic devices. A basic MOSFET comprises a gate electrode, a gate dielectric between gate electrode and a semiconductor channel, a source, and a drain. There are two types of MOSFETS. An n-type MOSFET employs electrons as the primary current carriers while a p-type MOSFET uses holes as primary current carriers. Vertical transport field-effect transistors (VTFETs) have configurations wherein the current between the drain and source regions is substantially normal to the surface of the die. A vertical transport field-effect transistor may, for example, include a semiconductor pillar or fin having top and bottom regions comprising source/drain regions, the portion of the pillar between the source/drain regions defining a channel region.

Vertical transport FETs (VTFETs) are a promising alternative to the standard lateral MOSFET structures due to potential benefits such as reduced circuit footprint. VTFETs can potentially provide electronic devices comprising logic circuits with improved circuit density.

SUMMARY

Embodiments of the present invention include a vertical transport field effect transistor (VTFET) comprising a cross bar shaped VTFET including three or more fins. Embodiments of the present invention include a vertical transport field effect transistor (VTFET) comprising a cross bar shaped VTFET including five or more fins.

Embodiments of the present invention include a method of forming a semiconductor structure. In a first embodiment, a first mask layer is formed on top of a semiconductor substrate. A mandrel material is formed perpendicular to the first mask layer. A second mask layer is formed on one or more exposed surfaces of the mandrel material. The mandrel material is removed. A pattern of the first mask layer and the second mask layer is transferred into the semiconductor substrate.

Embodiments of the present invention include a method of forming semiconductor structure. In a second embodiment, a first mask layer is formed on top of a semiconductor substrate. A first spacer layer is formed around the first mask layer. The first mask layer is removed. Removing the first mask layer creates a gap in the first spacer layer. A second spacer layer is formed around the first spacer layer. The second spacer layer fill the gap in the first spacer layer. The first spacer layer is removed. A pattern of a remaining second spacer layer is transferred into the semiconductor substrate.

Embodiments of the present invention include a method of forming semiconductor substrate. In a third embodiment, a mandrel material is formed on top of a semiconductor substrate. A first spacer layer is formed around the mandrel material. A second spacer layer is formed around the mandrel material and the first spacer material. A third spacer layer is formed around the mandrel material, the first spacer material, and the second spacer material. The mandrel material is removed. A portion of the second spacer layer is removed. The first spacer layer and the third spacer layer is removed. A pattern of the remaining second spacer layer is transferred into the semiconductor substrate.

BRIEF DESCRIPTION OF THE DRAWINGS

The above and other aspects, features, and advantages of various embodiments of the present invention will be more apparent from the following description taken in conjunction with the accompanying drawings.

FIG. 12A depicts a top view of a semiconductor structure after fabrication steps of deposition of a spacer layer on top of the pad layer illustrating locations of section X1' and section Y', in accordance with an embodiment of the present invention.

FIG. 12B depicts a cross-sectional view of section X1' of the semiconductor structure after fabrication steps of deposition of a spacer layer on top of the pad layer, in accordance with an embodiment of the present invention.

FIG. 12C depicts a cross-sectional view of section Y' of the semiconductor structure after fabrication steps of deposition of a spacer layer on top of the pad layer, in accordance with an embodiment of the present invention.

FIG. 13A depicts a top view of a semiconductor structure after fabrication steps of applying a cut masking layer over the material layer and the spacer layer illustrating locations of section X1' and section Y', in accordance with an embodiment of the present invention.

FIG. 13B depicts a cross-sectional view of section X1' of the semiconductor structure after fabrication steps of applying a cut masking layer over the material layer, in accordance with an embodiment of the present invention.

FIG. 13C depicts a cross-sectional view of section Y' of the semiconductor structure after fabrication steps of applying a cut masking layer over the material layer and the spacer layer, in accordance with an embodiment of the present invention.

FIG. 26A depicts a top view of a semiconductor structure after fabrication steps of applying a cut masking layer over the pad layer covering the mandrel material and first spacer material illustrating locations of section X1", in accordance with an embodiment of the present invention.

FIG. 26B depicts a cross-sectional view of section X1" of the semiconductor structure after fabrication steps of applying a cut masking layer over the pad layer covering the mandrel material and first spacer material, in accordance with an embodiment of the present invention.

FIG. 29A depicts a top view of a semiconductor structure after fabrication steps of depositing a second spacer material on top of the pad layer and around the mandrel material and the first spacer material illustrating locations of section X1", in accordance with an embodiment of the present invention.

FIG. 29B depicts a cross-sectional view of section X1" of the semiconductor structure after fabrication steps of depositing a second spacer material on top of the pad layer and around the mandrel material and the first spacer material, in accordance with an embodiment of the present invention.

FIG. 32A depicts a top view of a semiconductor structure after fabrication steps of selectively etching to remove the second spacer material illustrating locations of section X1", in accordance with an embodiment of the present invention.

FIG. 32B depicts a cross-sectional view of section X1" of the semiconductor structure after fabrication steps of selectively etching to remove the second spacer material, in accordance with an embodiment of the present invention.

DETAILED DESCRIPTION

Figure 1A:
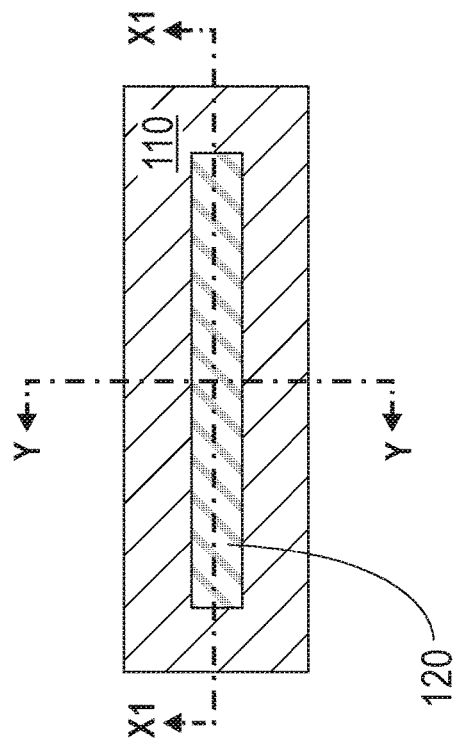
FIG. 1A depicts a top view of a semiconductor structure with a pad layer formed on top of the semiconductor substrate and a material layer deposited on top of the pad layer formed in a line illustrating locations of section X1 and section Y, in accordance with an embodiment of the present invention.

Embodiments of the present invention recognize 2D fins are required for vertical transport field effect transistors (VTFET). And more specifically, embodiments of the present invention recognize 2D fins are required for VTFET for improving the effective device width and thus effective drive current. Embodiments of the present invention recognize that the drawbacks of current VTFETs which have at least one of following issues, including but not limited to, lacking design flexibility, high parasitic capacitance, low drive current.

Embodiments of the present invention provide a method for 2D VTFET formation. Further, embodiments of the present invention provide a method for forming cross-bar fins in VTFET formation with any number of fins. Embodiments of the present invention provide a fin structure comprising two orthogonal segments which substantially the same fin width. Embodiments of the present invention provide methods for forming a cross bar VTFET fin with any number of fins.

Embodiments of the present invention provide at least the following advantages. First, embodiments of the present invention provide flexibility in forming cross-fin structures for VTFET with any desired number of find. Second, embodiments of the present invention provide for two orthogonal segments of the fin structure with a sharp corner. Third, embodiments of the present invention provide for a process of steps that are fully compatible with convention semiconductor manufacturing processes. In an embodiment, the VTFET may have three or more fins. In another embodiment, the VTFET may have five or more fins.

A first embodiment of the present invention provides a method of forming a VTFET with any number of fins. The method includes forming a pad layer on top of a semiconductor substrate and depositing a material layer in a line on top of the pad layer. A mandrel material is formed in lines on the pad layer and perpendicular to the material layer. An amorphous silicon (aSi) layer is formed around the mandrel material. A cut masking layer is applied over portions of the material layer, mandrel material, and aSi layer and portions of the material layer, mandrel material, and aSi layer not covered by the cut masking layer are removed. The cut masking layer is removed and the mandrel material is selectively removed. The remaining pattern is transferred into the pad layer and semiconductor structure. The remaining pattern can be formed, by using a cut masking layer, into a "+" fin, a "H" fin, "3" fin, a "4" fin, or any combination of numbering of fins.

A second embodiment of the present invention provides a method of forming a VTFET with any number of fins. The method includes forming a pad layer on top of a semiconductor substrate and depositing a material layer in a line on top of the pad layer. A spacer layer is formed on top of the pad layer and around the material layer. A cut masking layer is applied over at least a portion of the material layer and the spacer layer and the spacer layer and material layer not covered by the cut masking layer is removed. The cut masking layer is removed. The material layer is removed. A spacer material is deposited around the remaining spacer layer. A cut masking layer is applied over at least a portion of the spacer material and spacer layer and the spacer layer and spacer material not covered by the cut masking layer is removed. The cut masking layer is removed. The spacer layer is removed. The remaining pattern is transferred into the pad layer and semiconductor structure and the remaining spacer material and pad layer are removed.

A third embodiment of the present invention provides a method of forming a VTFET with any number of fins. The method includes forming a pad layer on top of a semiconductor substrate and depositing a mandrel material in a line on top of the pad layer. A first spacer material is applied on top of the pad layer and around the mandrel material. A cut masking layer is applied over at least a portion of the mandrel material and the first spacer material and any mandrel material and first spacer material not covered by the cut masking layer is removed. The cut masking layer is removed. A second spacer material is applied to the pad layer around the mandrel material and the first spacer material. A third spacer material is applied to the pad layer around the mandrel material, the first spacer material, and the second spacer material. The mandrel material is removed. A portion of the second spacer material is removed. The first spacer material is removed. The third spacer material is removed. The remaining pattern is transferred into the pad layer and semiconductor structure and the remaining spacer material and pad layer are removed.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" or "contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The figures represent cross-section portions of a semiconductor chip or a substrate, such as a semiconductor wafer during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Reference will now be made in detail to the embodiments of the present invention, examples of which are illustrated in the accompanying drawings, wherein like reference numerals refer to like elements throughout. FIGS. 1-10 depict a first embodiment for forming cross-bar fins with an arbitrary fin number. FIGS. 11-23 depict a second embodiment for forming cross-bar fins with an arbitrary fin number. FIGS. 24-35 depict a third embodiment for forming cross-bar fins with an arbitrary fin number.

FIG. 1A depicts a top view of a semiconductor structure with a pad layer 110 formed on top of the semiconductor substrate 100 and a first mask layer 120 deposited on top of the pad layer formed in a line, in accordance with an embodiment of the present invention. As depicted FIG. 1A illustrates a section X1 on the top view of the semiconductor structure and a section Y on the top view of the semiconductor structure.

Semiconductor substrate 100 is composed of any semiconductor substrate material suitable for forming one or more semiconductor devices with cross-bar fins. In various embodiments, semiconductor substrate 100 may be semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. III-V compound semiconductors may have a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). II-VI compound semiconductors may have a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In various embodiments, multiple layers of the semiconductor materials may be used as the semiconductor material of the semiconductor substrate 100. In some embodiments, the semiconductor substrate 100 includes both semiconductor materials and dielectric materials. The semiconductor substrate 100 may also comprise an organic semiconductor or a layered semiconductor such as, for example, Si/SiGe, a silicon-on-insulator or a SiGe-on-insulator. A portion the semiconductor substrate 100 or the entire semiconductor substrate 100 may be amorphous, polycrystalline, or monocrystalline. In addition to the aforementioned types of semiconductor substrates, the semiconductor substrate 100 employed in the present invention may also comprise a hybrid oriented (HOT) semiconductor substrate in which the HOT substrate has surface regions of different crystallographic orientation. The semiconductor substrate 100 may be doped, undoped or contain doped regions and undoped regions therein. The semiconductor substrate 100 may contain regions with strain and regions without strain therein, or contain regions of tensile strain and compressive strain. In some embodiments, the semiconductor substrate 100 includes other device structures (not shown) such as transistors, isolation structures (such as shallow trench isolations), contacts, conducting wires, etc.

In various embodiments, pad layer 110 is formed on top of the semiconductor substrate 100 using any method known in the art. In an embodiment, pad layer 110 is formed on top of semiconductor substrate 100 using atomic layer deposition (ALD). In an embodiment, pad layer 110 may consist of a material including, but not necessarily limited to, silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), siliconboron carbonitride (SiBCN), silicon oxycarbonitride (SiOCN), silicon oxide, titanium nitride (TiN) or any combination thereof. In an embodiment, pad layer 110 may be any thickness. In an embodiment, pad layer 110 may have a thickness in the range of 10 nanometers (nm) to 100 nm.

In various embodiments, first mask layer 120 is formed on top of the pad layer 110 using any method known in the art. In an embodiment, first mask layer 120 is formed on top of pad layer 110 by a deposition process followed by a patterning process. In an embodiment, first mask layer 120 is deposited by using chemical vapor deposition (CVD) followed by a patterning process using sidewall image transfer (SIT) to control the width in the Y direction of first mask layer 120. Any other suitable deposition and patterning techniques can be used. In an embodiment, first mask layer 120 may consist of a material including, but not necessarily limited to, silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), siliconboron carbonitride (SiBCN), silicon oxycarbonitride (SiOCN), silicon oxide, titanium nitride (TiN), or any combination thereof. In an embodiment, first mask layer 120 and pad layer 110 are not made from the same material. In an embodiment, first mask layer 120 may be any thickness. In an embodiment, first mask layer 120 may have a thickness in the range of 50 nm to 300 nm. In an embodiment, first mask layer 120 may be any width. In an embodiment, first mask layer 120 may be have a width in the range of 5 nm to 20 nm. While depicted as a single first mask layer 120, first mask layer 120 is not limited to a single first mask layer 120 and there may be any number.

Figure 1C:
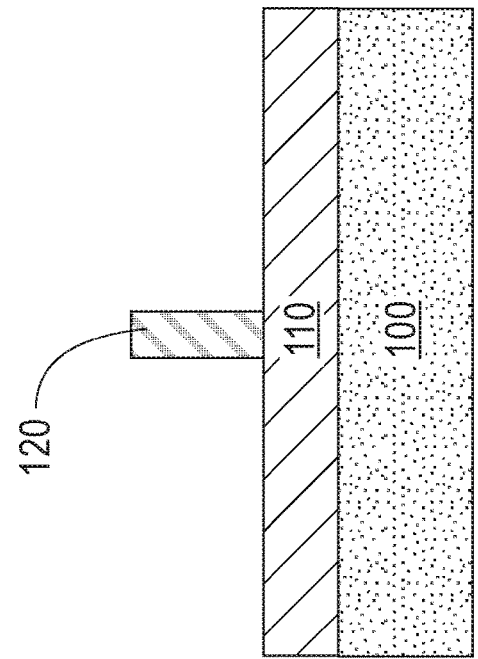
FIG. 1C depicts a cross-sectional view of section Y of the semiconductor structure with a pad layer formed on top of the semiconductor substrate and a material layer deposited on top of the pad layer formed in a line, in accordance with an embodiment of the present invention.
Figure 1B:
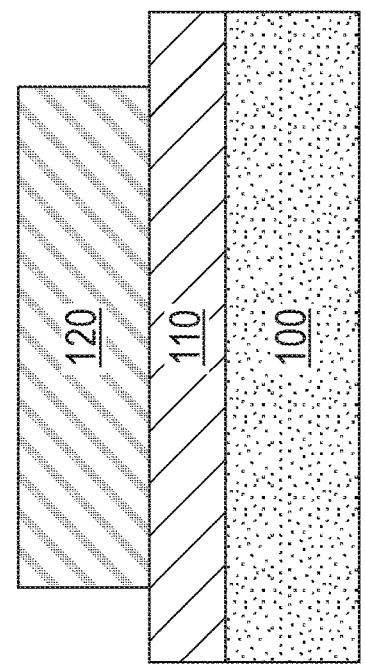
FIG. 1B depicts a cross-sectional view of section X1 of the semiconductor structure with a pad layer formed on top of the semiconductor substrate and a material layer deposited on top of the pad layer formed in a line, in accordance with an embodiment of the present invention.

FIG. 1B depicts a cross-sectional view of the semiconductor structure along section X1, in accordance with an embodiment of the present invention. As depicted, FIG. 1B includes semiconductor substrate 100, pad layer 110, and first mask layer 120. FIG. 1C depicts a cross-sectional view of the semiconductor structure along section Y, in accordance with an embodiment of the present invention. As depicted, FIG. 1C includes semiconductor substrate 100, pad layer 110, and first mask layer 120.

Figure 2A:
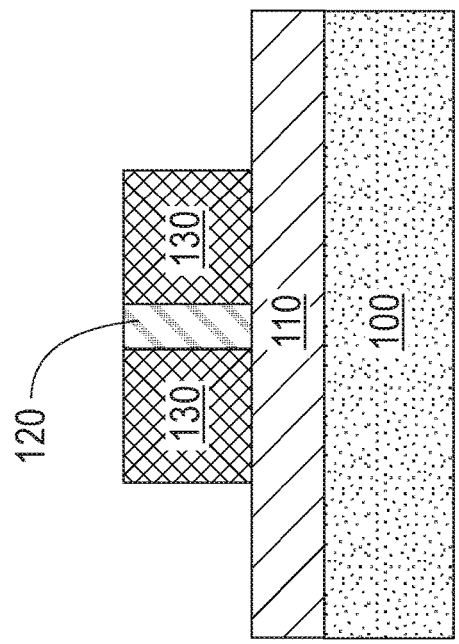
FIG. 2A depicts a top view of a semiconductor structure after fabrication steps depositing a mandrel material illustrating locations of section X1, section Y and section X2, in accordance with an embodiment of the present invention.

FIG. 2A depicts a top view of a semiconductor structure after fabrication steps depositing a mandrel material 130 illustrating locations of section X1, section Y and section X2, in accordance with an embodiment of the present invention. In various embodiments, mandrel material 130 is formed on top of the pad layer 110 and perpendicularly to first mask layer 120 using any method known in the art. Mandrel material 130 is formed as four separate pieces and two of the pieces forming a "stripe" in a patterning process. In some embodiment, the patterning process for patterning mandrel material 130 is selective to first mask layer 120, in other words when mandrel material 130 is etched, material layer 130 remains substantially intact. In an embodiment, these two of the pieces of mandrel material 130 that form the "stripe" are on opposite sides of first mask layer 120 and each of the two pieces that form the "stripe" of mandrel material 130 being parallel to the other piece that form the "stripe". In an embodiment, mandrel material 130 may consist of a material including, but not necessarily limited to, amorphous silicon (aSi), polycrystalline silicon, amorphous silicon germanium (aSiGe), polycrystalline silicon germanium, or any combination thereof. In some embodiments, a planarization process (e.g., chemical mechanical polishing (CMP)) may be performed after deposition of mandrel material 130. In an embodiment, mandrel material 130 may be any thickness. In an embodiment, mandrel material 130 may have a thickness substantially the same as first mask layer 120. In an embodiment, the mandrel material 130 may comprise aSiGe deposited by CVD process, planarized by CMP process, and patterned by sidewall image transfer (SIT) process.

Figure 2C:
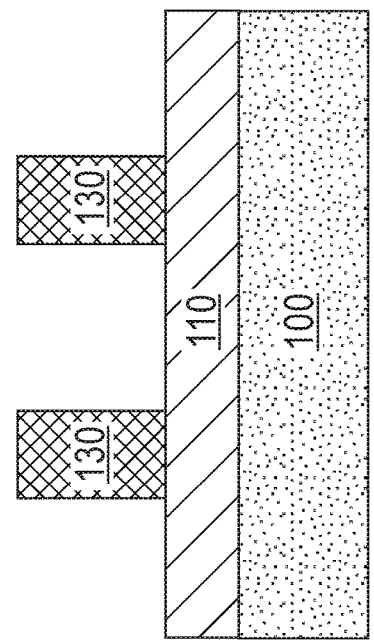
FIG. 2C depicts a cross-section view of section Y of the semiconductor structure after fabrication steps depositing a mandrel material, in accordance with an embodiment of the present invention.
Figure 2B:
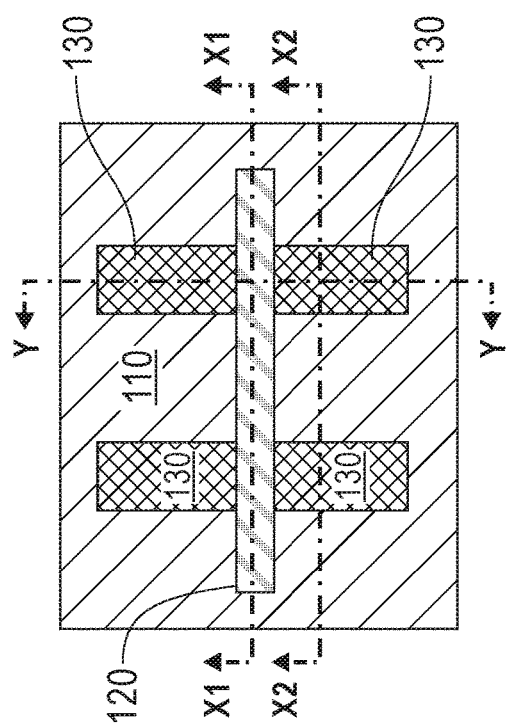
FIG. 2B depicts a cross-section view of section X1 of the semiconductor structure after fabrication steps depositing a mandrel material, in accordance with an embodiment of the present invention.
Figure 2D:
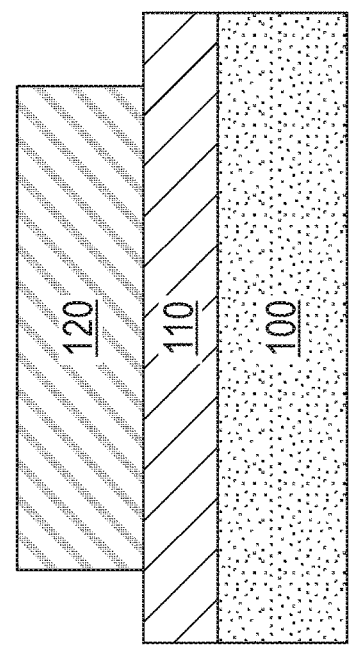
FIG. 2D depicts a cross-section view of section X2 of the semiconductor structure after fabrication steps depositing a mandrel material, in accordance with an embodiment of the present invention.

FIG. 2B depicts a cross-section view of section X1 of the semiconductor structure after fabrication steps depositing a mandrel material, in accordance with an embodiment of the present invention. FIG. 2C depicts a cross-section view of section Y of the semiconductor structure after fabrication steps depositing a mandrel material, in accordance with an embodiment of the present invention. As shown in FIG. 2C, each part of mandrel material 130 located on either side of first mask layer 120 has a lateral width of 10 nm to 50 nm. FIG. 2D depicts a cross-section view of section X2 of the semiconductor structure after fabrication steps depositing a mandrel material, in accordance with an embodiment of the present invention. As shown in FIG. 2D, each section of mandrel material 130 may have a lateral width of 10 nm to 50 nm.

Figure 3C:
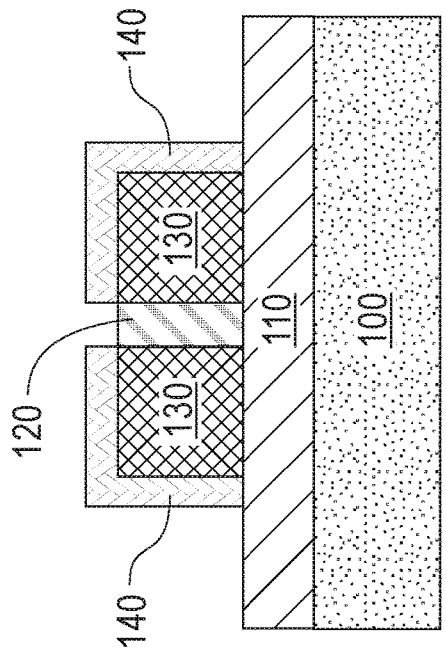
FIG. 3C depicts a cross-section view of section Y of the semiconductor structure after fabrication steps of forming an amorphous silicon layer around mandrel material, in accordance with an embodiment of the present invention.
Figure 3D:
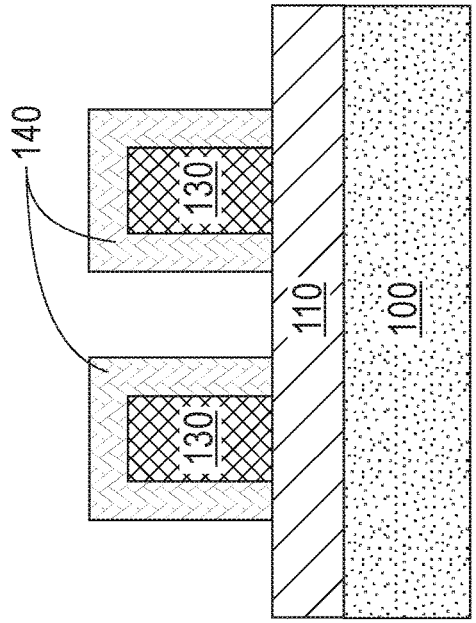
FIG. 3D depicts a cross-section view of section X2 of the semiconductor structure after fabrication steps of forming an amorphous silicon layer around mandrel material, in accordance with an embodiment of the present invention.
Figure 3A:
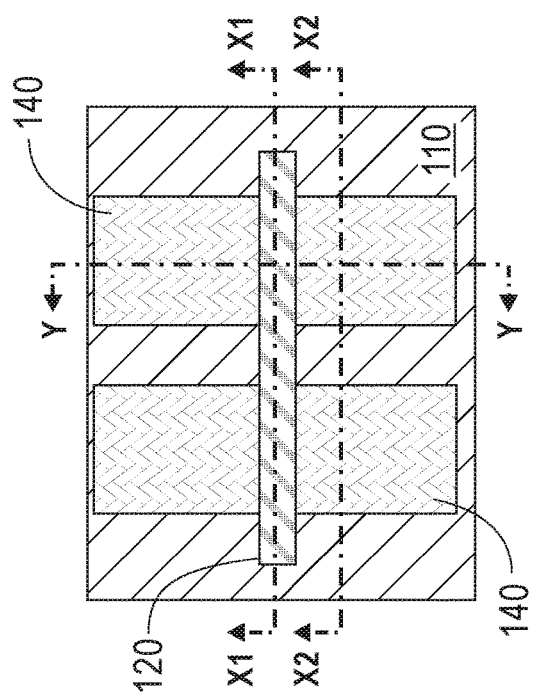
FIG. 3A depicts a top view of a semiconductor structure after fabrication steps of forming an amorphous silicon layer around mandrel material illustrating locations of section X1, section Y and section X2, in accordance with an embodiment of the present invention.

FIG. 3A depicts a top view of a semiconductor structure after fabrication steps of forming a second mask layer 140 around mandrel material 130 illustrating locations of section X1, section Y and section X2, in accordance with an embodiment of the present invention. In various embodiments, second mask layer 140 is formed around the mandrel material 130 using selective deposition, meaning amorphous silicon (aSi) is deposited only on the exposed surfaces of aSiGe (both aSi and aSiGe are semiconductors) but not on pad layer 110 and first mask layer 120. In an alternative embodiment, second mask layer 140 may be made of polycrystalline Si. The selective deposition of the second mask layer 140, as shown in FIG. 3A, forms the second mask layer 140 around the mandrel material 130 and on the exposed surfaces of the mandrel material 130 but not on the surfaces of first mask layer 120. In an embodiment, mandrel material 130 may have a thickness of 10 nm to 50 nm. In one embodiment, the second mask layer 140 is deposited by selective atomic layer deposition (ALD) process. In another embodiment, the second mask layer 140 is deposited by selective chemical vapor deposition process (CVD).

Figure 3B:
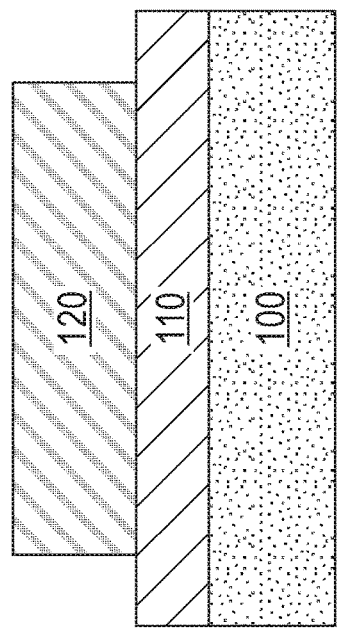
FIG. 3B depicts a cross-section view of section X1 of the semiconductor structure after fabrication steps of forming an amorphous silicon layer around mandrel material, in accordance with an embodiment of the present invention.

FIG. 3B depicts a cross-section view of section X1 of the semiconductor structure after fabrication steps of forming a second mask layer 140 around mandrel material 130, in accordance with an embodiment of the present invention. FIG. 3C depicts a cross-section view of section Y of the semiconductor structure after fabrication steps of forming a second mask layer 140 around mandrel material 130, in accordance with an embodiment of the present invention. As shown in FIG. 3C, second mask layer 140 is formed around the exposed surfaces of the mandrel material 130 but not on the surfaces of first mask layer 120. FIG. 3D depicts a cross-section view of section X2 of the semiconductor structure after fabrication steps of forming a second mask layer 140 around mandrel material 130, in accordance with an embodiment of the present invention.

Figure 4C:
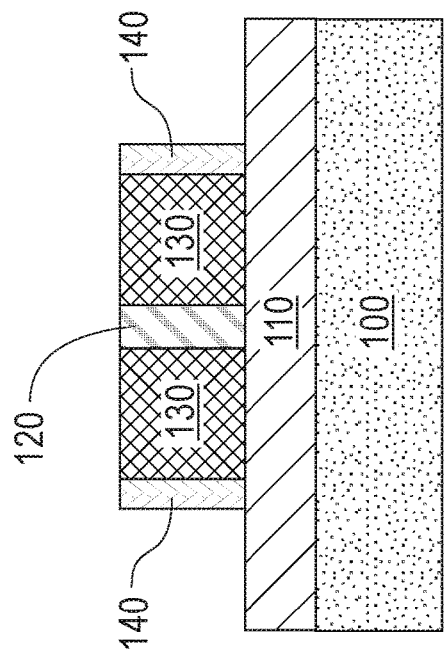
FIG. 4C depicts a cross-section view of section Y of the semiconductor structure after fabrication steps of reactive-ion etching to form the amorphous silicon layer around the mandrel material, in accordance with an embodiment of the present invention.
Figure 4D:
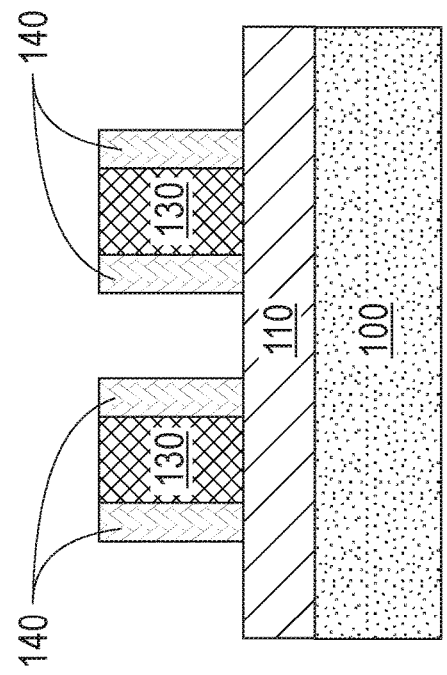
FIG. 4D depicts a cross-section view of section X2 of the semiconductor structure after fabrication steps of reactive-ion etching to form the amorphous silicon layer around the mandrel material, in accordance with an embodiment of the present invention.
Figure 4A:
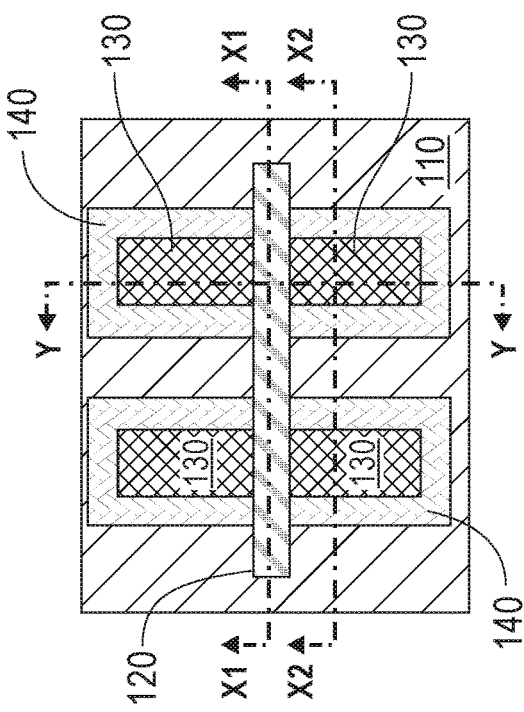
FIG. 4A depicts a top view of a semiconductor structure after fabrication steps of reactive-ion etching to form the amorphous silicon layer around the mandrel material illustrating locations of section X1, section Y and section X2, in accordance with an embodiment of the present invention.

FIG. 4A depicts a top view of a semiconductor structure after fabrication steps of reactive-ion etching to form the second mask layer 140 around the mandrel material 130 illustrating locations of section X1, section Y and section X2, in accordance with an embodiment of the present invention. In various embodiments, the reactive-ion etching is a directional etch that removes the second mask layer 140 on the horizontal surfaces of the mandrel material 130 while leaving the second mask layer 140 on the vertical sidewalls of mandrel material 130.

Figure 4B:
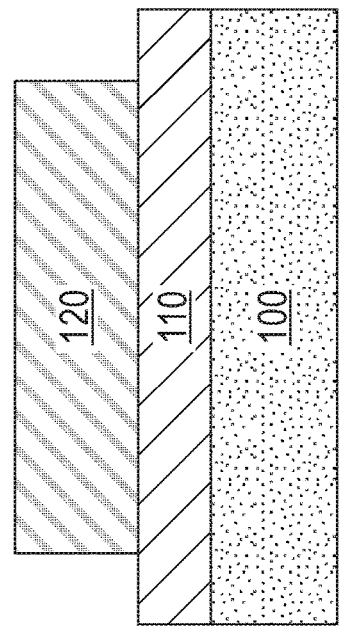
FIG. 4B depicts a cross-section view of section X1 of the semiconductor structure after fabrication steps of reactive-ion etching to form the amorphous silicon layer around the mandrel material, in accordance with an embodiment of the present invention.

FIG. 4B depicts a cross-section view of section X1 of the semiconductor structure after fabrication steps of reactive-ion etching to form a second mask layer 140 around the mandrel material 130, in accordance with an embodiment of the present invention. FIG. 4C depicts a cross-section view of section Y of the semiconductor structure after fabrication steps of reactive-ion etching to form a second mask layer 140 around the mandrel material 130, in accordance with an embodiment of the present invention. As shown in FIG. 4C, the second mask layer 140 on the horizontal surfaces of the mandrel material 130 has been removed while leaving the second mask layer 140 on the vertical sidewalls of mandrel material 130. FIG. 4D depicts a cross-section view of section X2 of the semiconductor structure after fabrication steps of reactive-ion etching to form a second mask layer 140 around the mandrel material 130, in accordance with an embodiment of the present invention. As shown in FIG. 4D, the second mask layer 140 on the horizontal surfaces of the mandrel material 130 has been removed while leaving the second mask layer 140 on the vertical sidewalls of mandrel material 130. In some embodiments, the width of the second mask layer 140 is substantially the same as the width of the first mask layer 120 so that materials of second mask layer 140 and first mask layer 120 can be used in combination to form cross-bar fins with substantially the same fin width.

Figure 5C:
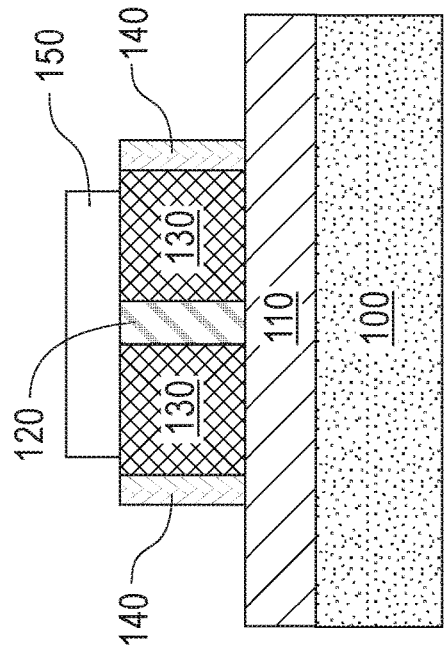
FIG. 5C depicts a cross-section view of section Y of the semiconductor structure after fabrication steps of forming a cut masking layer, in accordance with an embodiment of the present invention.
Figure 5D:
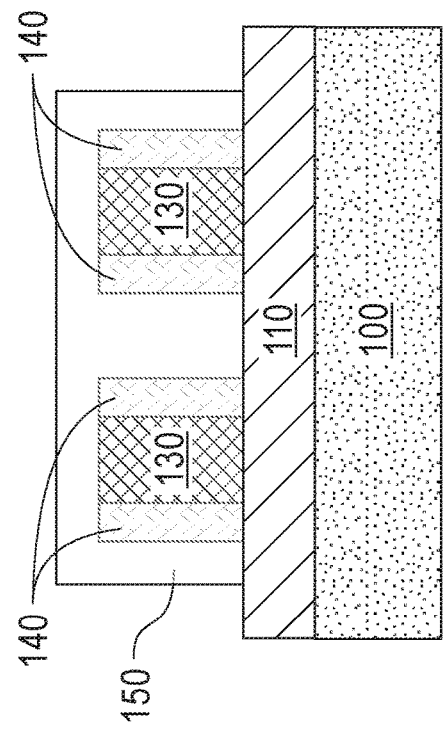
FIG. 5D depicts a cross-section view of section X2 of the semiconductor structure after fabrication steps of forming a cut masking layer, in accordance with an embodiment of the present invention.
Figure 5A:
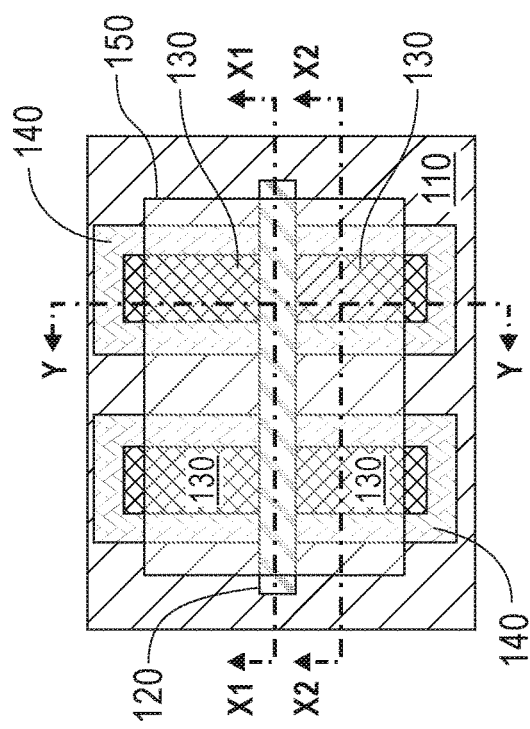
FIG. 5A depicts a top view of a semiconductor structure after fabrication steps of forming a cut masking layer illustrating locations of section X1, section Y and section X2, in accordance with an embodiment of the present invention.

FIG. 5A depicts a top view of a semiconductor structure after fabrication steps of forming a cut masking layer 150 illustrating locations of section X1, section Y and section X2, in accordance with an embodiment of the present invention. In various embodiments, cut masking layer 150 covers the entirety of both mandrel material 130 and second mask layer 140 in the X direction, as shown in FIG. 5A and FIG. 5D. In various embodiments, cut masking layer 150 covers at least part of both mandrel material 130 and second mask layer 140 in the Y direction, as shown in FIG. 5A and FIG. 5C. In various embodiment, the cut masking layer 150 may be a softmask layer (e.g., photoresist) or a hardmask layer (e.g., titanium nitride). In various embodiments, the cut masking layer 150 may be a single layer or may be multiple layers. In various embodiment, the cut masking layer 150 may be formed by lithography. In some embodiment, the cut masking layer 150 may be formed by lithography followed by patterning techniques known in the art.

Figure 5B:
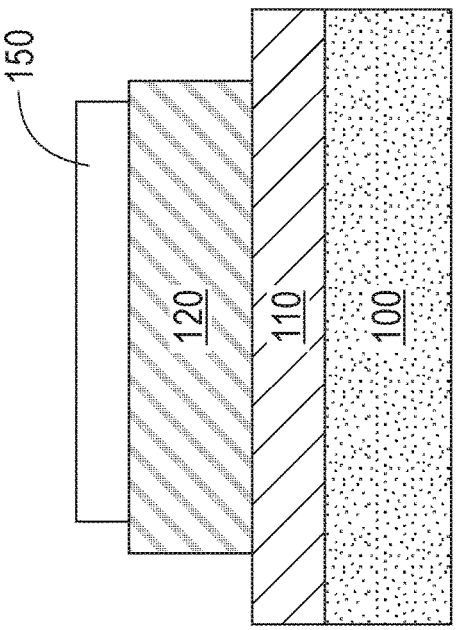
FIG. 5B depicts a cross-section view of section X1 of the semiconductor structure after fabrication steps of forming a cut masking layer, in accordance with an embodiment of the present invention.

FIG. 5B depicts a cross-section view of section X1 of the semiconductor structure after fabrication steps of forming a cut masking layer 150, in accordance with an embodiment of the present invention. FIG. 5C depicts a cross-section view of section Y of the semiconductor structure after fabrication steps of forming a cut masking layer 150, in accordance with an embodiment of the present invention. As shown in FIG. 5C, and discussed above, cut masking layer 150 covers at least part of both mandrel material 130 and second mask layer 140 in the Y direction. FIG. 5D depicts a cross-section view of section X2 of the semiconductor structure after fabrication steps of forming a cut masking layer 150, in accordance with an embodiment of the present invention. As shown in FIG. 5D, and discussed above, cut masking layer 150 covers the entirety of both mandrel material 130 and second mask layer 140 in the X direction.

Figure 6A:
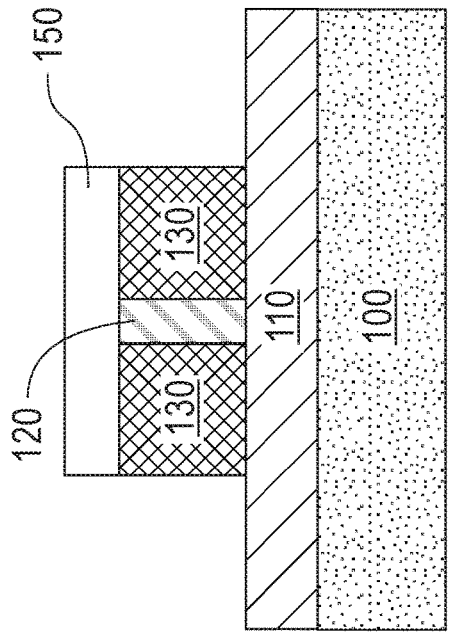
FIG. 6A depicts a top view of a semiconductor structure after fabrication steps of selectively removing mandrel material and amorphous silicon using reactive-ion etching illustrating locations of section X1, section Y and section X2, in accordance with an embodiment of the present invention.
Figure 6B:
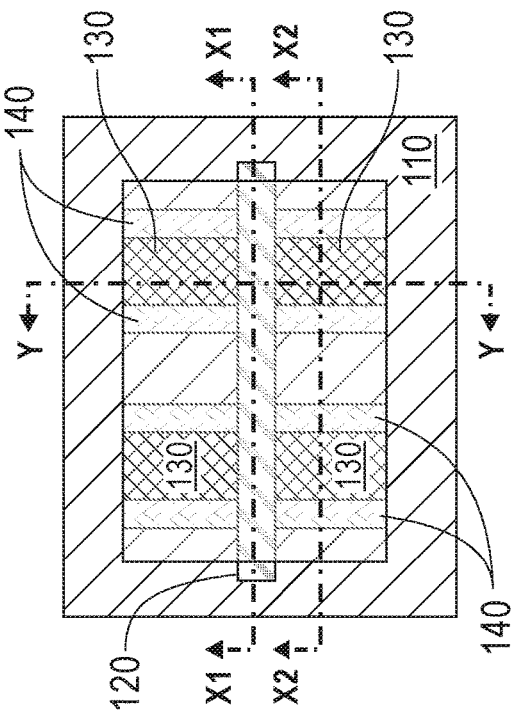
FIG. 6B depicts a cross-section view of section X1 of the semiconductor structure after fabrication steps of selectively removing mandrel material and amorphous silicon using reactive-ion etching, in accordance with an embodiment of the present invention.
Figure 6C:
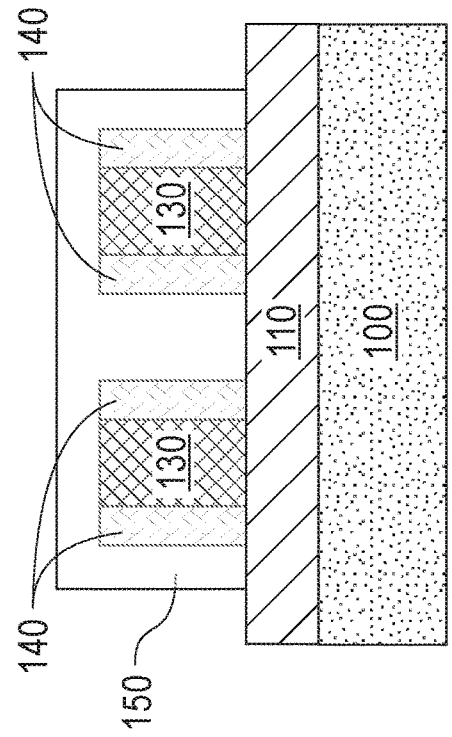
FIG. 6C depicts a cross-section view of section Y of the semiconductor structure after fabrication steps of selectively removing mandrel material and amorphous silicon using reactive-ion etching, in accordance with an embodiment of the present invention.
Figure 6D:
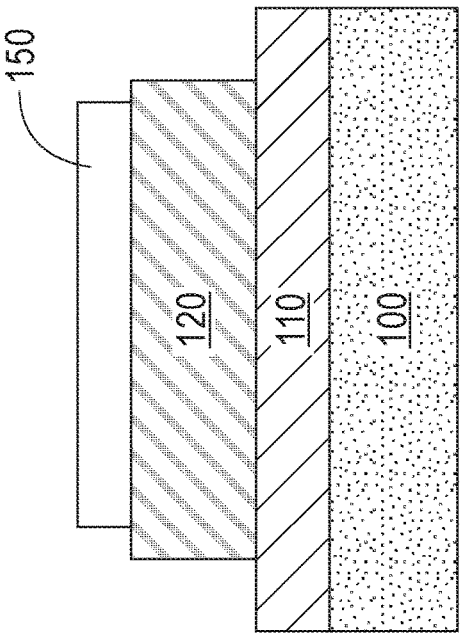
FIG. 6D depicts a cross-section view of section X2 of the semiconductor structure after fabrication steps of selectively removing mandrel material and amorphous silicon using reactive-ion etching, in accordance with an embodiment of the present invention.

FIG. 6A depicts a top view of a semiconductor structure after fabrication steps of selectively removing mandrel material 130 and second mask layer 140 using reactive-ion etching illustrating locations of section X1, section Y and section X2, in accordance with an embodiment of the present invention. As shown in FIG. 6A, reactive-ion etching is used to remove mandrel material 130 and second mask layer 140 not covered by cut masking layer 150. FIG. 6B depicts a cross-section view of section X1 of the semiconductor structure after fabrication steps of selectively removing mandrel material 130 and second mask layer 140 using reactive-ion etching, in accordance with an embodiment of the present invention. FIG. 6C depicts a cross-section view of section Y of the semiconductor structure after fabrication steps of selectively removing mandrel material 130 and second mask layer 140 using reactive-ion etching, in accordance with an embodiment of the present invention. FIG. 6D depicts a cross-section view of section X2 of the semiconductor structure after fabrication steps of selectively removing mandrel material 130 and second mask layer 140 using reactive-ion etching, in accordance with an embodiment of the present invention.

Figure 7C:
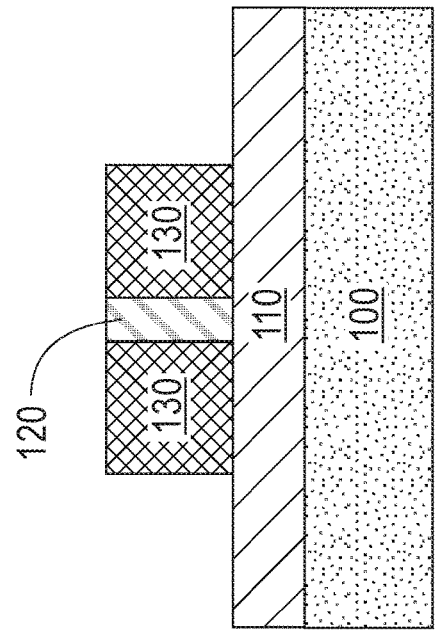
FIG. 7C depicts a cross-section view of section Y of the semiconductor structure after fabrication steps of removing the cut masking layer, in accordance with an embodiment of the present invention.
Figure 7D:
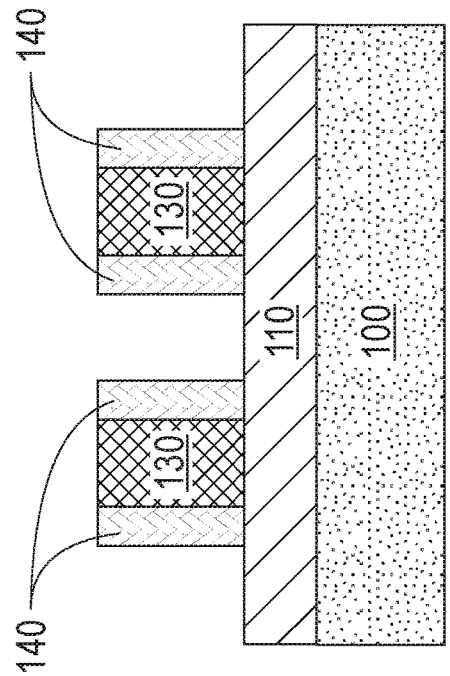
FIG. 7D depicts a cross-section view of section X2 of the semiconductor structure after fabrication steps of removing the cut masking layer, in accordance with an embodiment of the present invention.
Figure 7A:
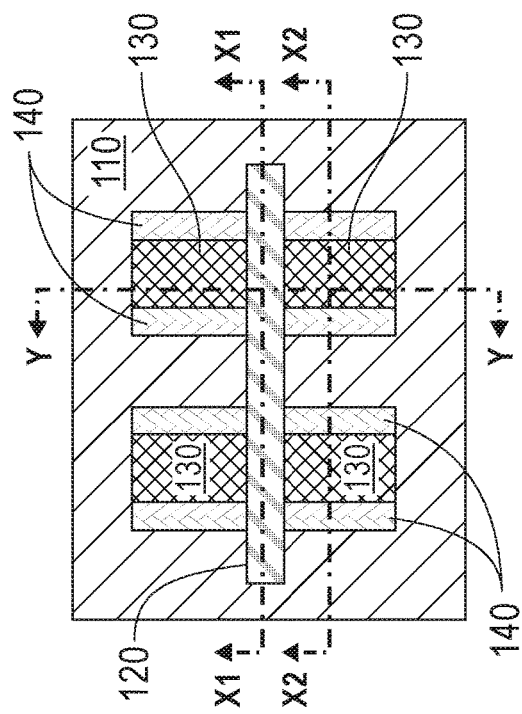
FIG. 7A depicts a top view of a semiconductor structure after fabrication steps of removing the cut masking layer illustrating locations of section X1, section Y and section X2, in accordance with an embodiment of the present invention.
Figure 7B:
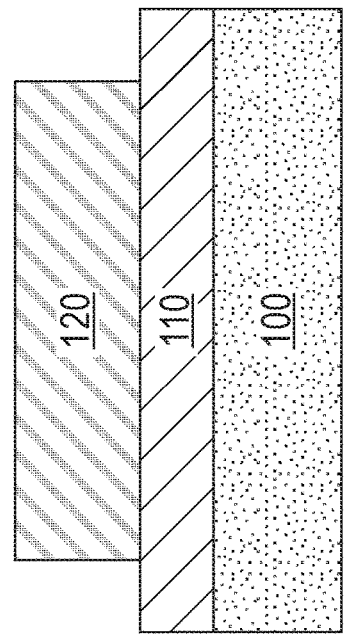
FIG. 7B depicts a cross-section view of section X1 of the semiconductor structure after fabrication steps of removing the cut masking layer, in accordance with an embodiment of the present invention.

FIG. 7A depicts a top view of a semiconductor structure after fabrication steps of removing the cut masking layer 150 illustrating locations of section X1, section Y and section X2, in accordance with an embodiment of the present invention. In embodiments of the invention, cut masking layer 150, when made as a photoresist layer, may be removed using an ashing process (e.g., oxygen plasma process). In alternative embodiments, cut masking layer 150 may be removed using any known process in the art such as a suitable etching process based on the type of cut masking layer 150. FIG. 7B depicts a cross-section view of section X1 of the semiconductor structure after fabrication steps of removing the cut masking layer 150, in accordance with an embodiment of the present invention. FIG. 7C depicts a cross-section view of section Y of the semiconductor structure after fabrication steps of removing the cut masking layer 150, in accordance with an embodiment of the present invention. FIG. 7D depicts a cross-section view of section X2 of the semiconductor structure after fabrication steps of removing the cut masking layer 150, in accordance with an embodiment of the present invention.

Figure 8A:
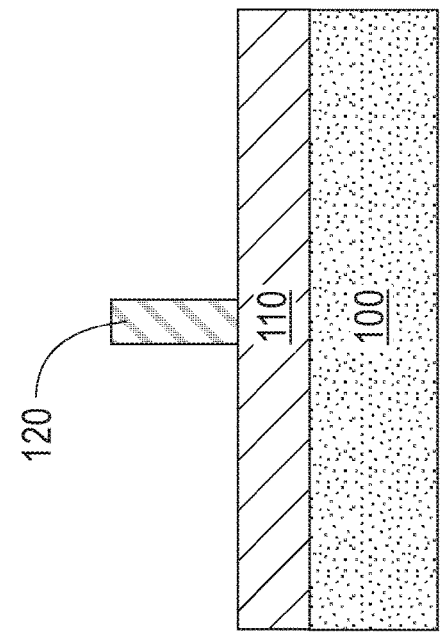
FIG. 8A depicts a top view of a semiconductor structure after fabrication steps of removing the mandrel material illustrating locations of section X1, section Y and section X2, in accordance with an embodiment of the present invention.
Figure 8C:
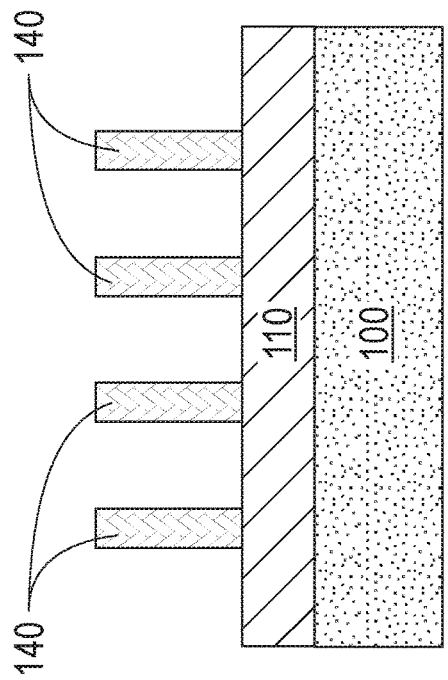
FIG. 8C depicts a cross-section view of section Y of the semiconductor structure after fabrication steps of removing the mandrel material, in accordance with an embodiment of the present invention.
Figure 8B:
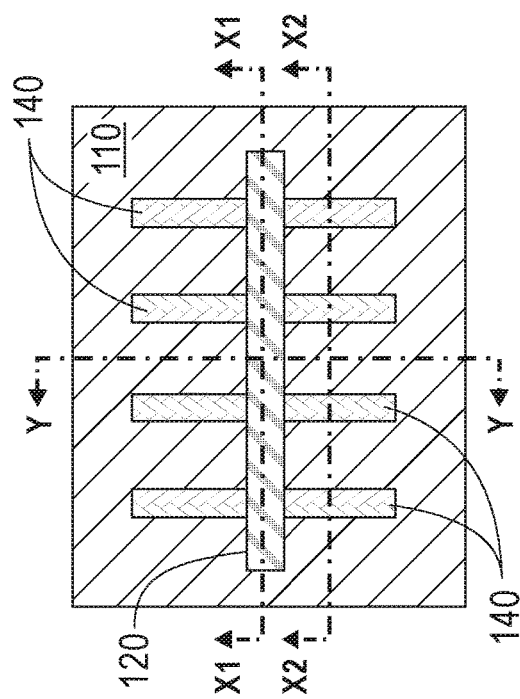
FIG. 8B depicts a cross-section view of section X1 of the semiconductor structure after fabrication steps of removing the mandrel material, in accordance with an embodiment of the present invention.
Figure 8D:
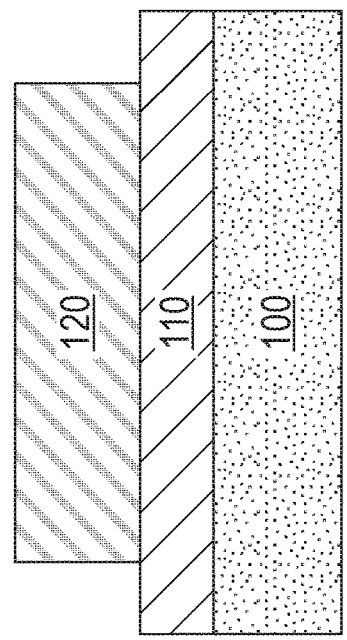
FIG. 8D depicts a cross-section view of section X2 of the semiconductor structure after fabrication steps of removing the mandrel material, in accordance with an embodiment of the present invention.

FIG. 8A depicts a top view of a semiconductor structure after fabrication steps of removing the mandrel material 130 illustrating locations of section X1, section Y and section X2, in accordance with an embodiment of the present invention. In various embodiments, mandrel material 130 may be removed using any known process in the art based on the material of mandrel material 130. In an embodiment, mandrel material 130 may comprise silicon germanium (SiGe) and may be removed using an aqueous solution containing ammonia and hydroperoxide. In an alternative embodiments, mandrel material 130 may comprise silicon germanium (SiGe) and may be removed using a gas phase hydrogen chloride (HCl.) FIG. 8B depicts a cross-section view of section X1 of the semiconductor structure after fabrication steps of removing the mandrel material 130, in accordance with an embodiment of the present invention. FIG. 8C depicts a cross-section view of section Y of the semiconductor structure after fabrication steps of removing the mandrel material 130, in accordance with an embodiment of the present invention. FIG. 8D depicts a cross-section view of section X2 of the semiconductor structure after fabrication steps of removing the mandrel material 130, in accordance with an embodiment of the present invention.

Figure 9C:
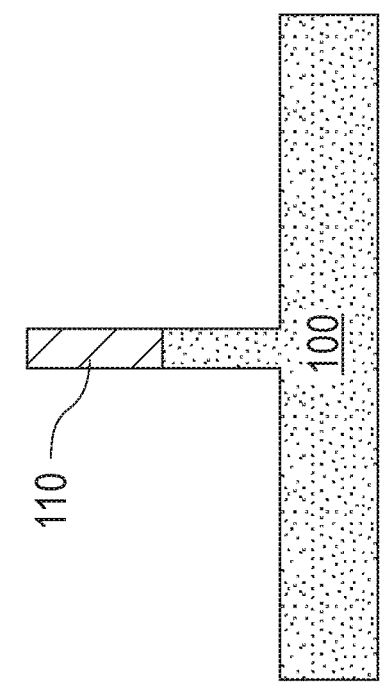
FIG. 9C depicts a cross-section view of section Y of the semiconductor structure after fabrication steps of transferring the pattern into the pad layer and semiconductor structure, in accordance with an embodiment of the present invention.
Figure 9D:
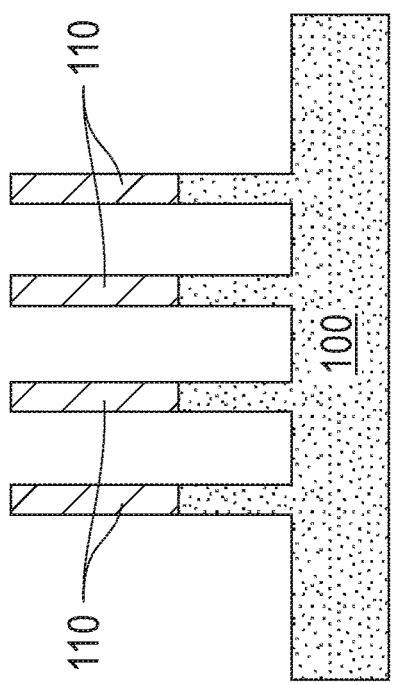
FIG. 9D depicts a cross-section view of section X2 of the semiconductor structure after fabrication steps of transferring the pattern into the pad layer and semiconductor structure, in accordance with an embodiment of the present invention.
Figure 9A:
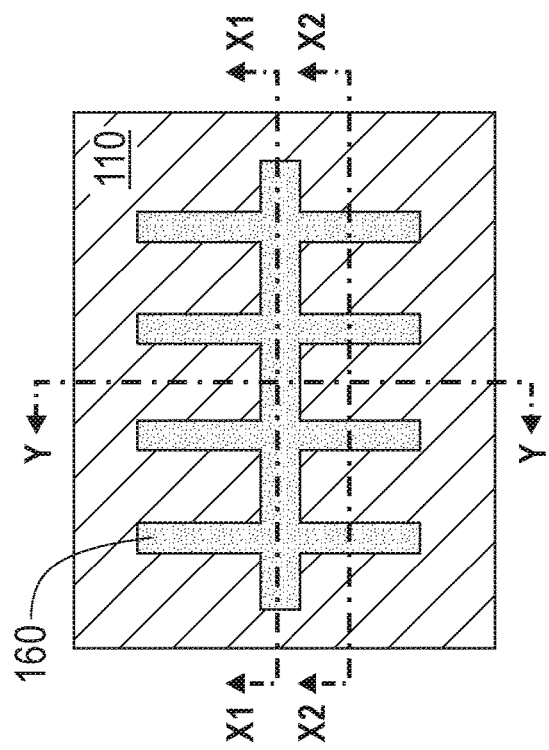
FIG. 9A depicts a top view of a semiconductor structure after fabrication steps of transferring the pattern into the pad layer and semiconductor structure illustrating locations of section X1, section Y and section X2, in accordance with an embodiment of the present invention.
Figure 9B:
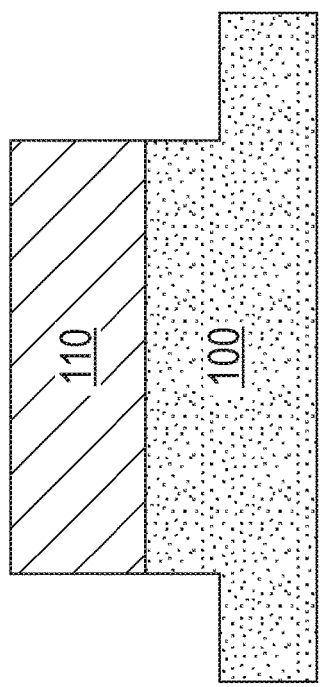
FIG. 9B depicts a cross-section view of section X1 of the semiconductor structure after fabrication steps of transferring the pattern into the pad layer and semiconductor structure, in accordance with an embodiment of the present invention.

FIG. 9A depicts a top view of a semiconductor structure after fabrication steps of transferring the pattern into the pad layer 110 and semiconductor structure 100 illustrating locations of section X1, section Y and section X2, in accordance with an embodiment of the present invention. In various embodiments, the pattern formed by the remaining first mask layer 120 and second mask layer 140 is transferred into the pad layer 110 and semiconductor substrate 100 using reactive-ion etching to form the fins. In various embodiments, the first mask layer 120 and second mask layer 140 is consumed during the reactive-ion etching. FIG. 9B depicts a cross-section view of section X1 of the semiconductor structure after fabrication steps of transferring the pattern into the pad layer 110 and semiconductor structure 100, in accordance with an embodiment of the present invention. FIG. 9C depicts a cross-section view of section Y of the semiconductor structure after fabrication steps of transferring the pattern into the pad layer 110 and semiconductor structure 100, in accordance with an embodiment of the present invention. FIG. 9D depicts a cross-section view of section X2 of the semiconductor structure after fabrication steps of transferring the pattern into the pad layer 110 and semiconductor structure 100, in accordance with an embodiment of the present invention.

Figure 10A:
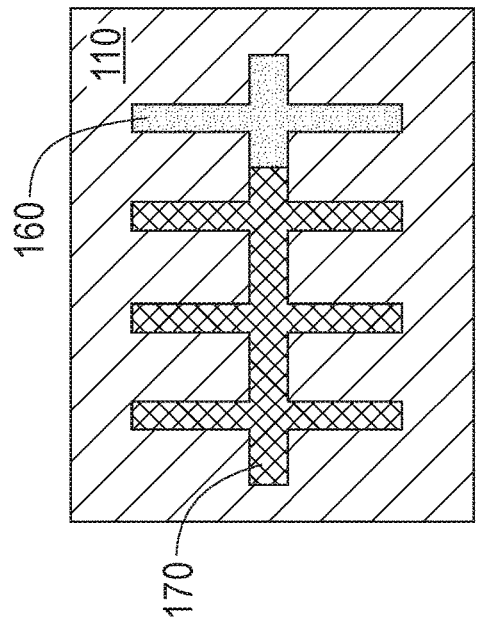
FIG. 10A depicts a top view of a semiconductor structure after fabrication steps of using a cut masking layer to form a "+" fin, in accordance with an embodiment of the present invention.

FIG. 10A depicts a top view of a semiconductor structure after fabrication steps of using a cut masking layer 170A to form a "+" fin, in accordance with an embodiment of the present invention. In various embodiments, cut masking layer 170A is formed and the remaining pad layer 110 is removed along with removal of the semiconductor substrate 100 that is located above the horizontal portion of semiconductor substrate 100. In various embodiment, cut masking layer 170A may be formed over the area where cross-bar fins will be formed. In an embodiment, fins not covered by the cut masking layer will be removed In various embodiments, cut masking layer 170A may be made of substantially similar materials as cut masking layer 150, discussed above, and, after the formation of the "+" fin, the cut masking layer 170A may be removed using substantially similar processes used to remove cut masking layer 150, discussed above.

Figure 10C:
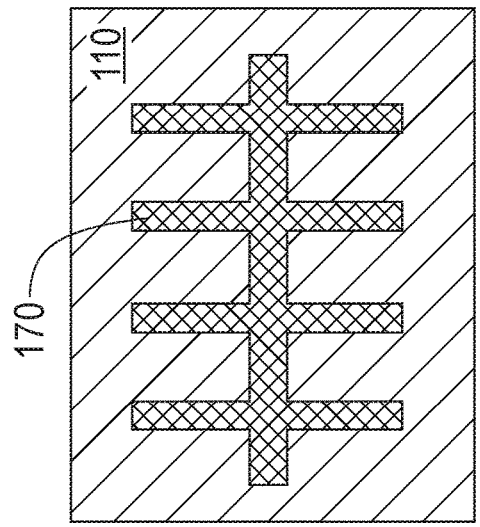
FIG. 10C depicts a top view of a semiconductor structure after fabrication steps of using a cut masking layer to form a "3" fin, in accordance with an embodiment of the present invention.
Figure 10B:
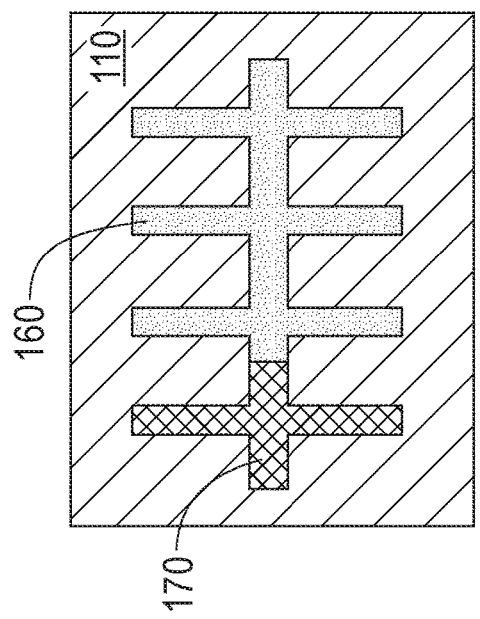
FIG. 10B depicts a top view of a semiconductor structure after fabrication steps of using a cut masking layer to form a "H" fin, in accordance with an embodiment of the present invention.

FIG. 10B depicts a top view of a semiconductor structure after fabrication steps of using a cut masking layer 170B to form a "H" fin, in accordance with an embodiment of the present invention. In various embodiment, cut masking layer 170B may be formed over area where cross-bar fins will be formed. In an embodiment, fins not covered by the cut masking layer will be removed In various embodiments, cut masking layer 170B may be made of substantially similar materials as cut masking layer 150, discussed above, and, after the formation of the "H" fin, the cut masking layer 170B may be removed using substantially similar processes used to remove cut masking layer 150, discussed above.

FIG. 10C depicts a top view of a semiconductor structure after fabrication steps of using a cut masking layer 170C to form a fin structure with 3 pairs of branches, in accordance with an embodiment of the present invention. In various embodiment, cut masking layer 170C may be formed over area where cross-bar fins will be formed. In an embodiment, fins not covered by the cut masking layer will be removed In various embodiments, cut masking layer 170C may be made of substantially similar materials as cut masking layer 150, discussed above, and, after the formation of the "3" fin, the cut masking layer 170C may be removed using substantially similar processes used to remove cut masking layer 150, discussed above.

Figure 10D:
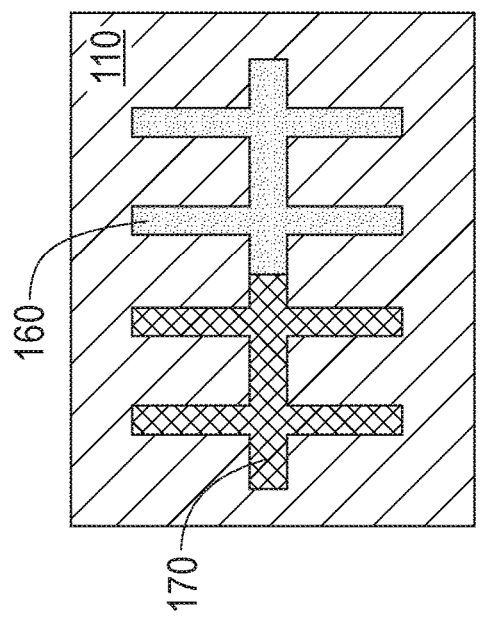
FIG. 10D depicts a top view of a semiconductor structure after fabrication steps of using a cut masking layer to form a "4" fin, in accordance with an embodiment of the present invention.

FIG. 10D depicts a top view of a semiconductor structure after fabrication steps of using a cut masking layer 170D to form a fin structure with 4 pairs of branches, in accordance with an embodiment of the present invention. In various embodiments, cut masking layer 170D is formed and the remaining pad layer 110 is removed along with removal of the semiconductor substrate 100 that is located above the horizontal portion of semiconductor substrate 100. In various embodiment, cut masking layer 170D may be formed over area where cross-bar fins will be formed. In an embodiment, fins not covered by the cut masking layer will be removed. In various embodiments, cut masking layer 170D may be made of substantially similar materials as cut masking layer 150, discussed above, and, after the formation of the "4" fin, the cut masking layer 170D may be removed using substantially similar processes used to remove cut masking layer 150, discussed above.

Figure 11A:
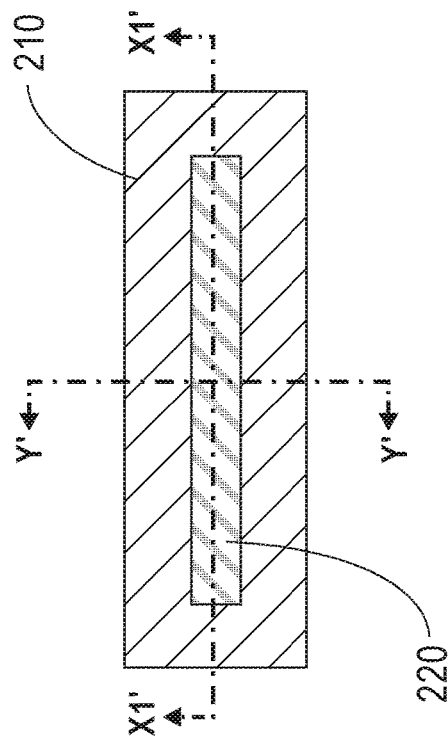
FIG. 11A depicts a top view of a semiconductor structure with a pad layer formed on top of the semiconductor substrate and a material layer deposited and patterned to form a line illustrating locations of section X1' and section Y', in accordance with an embodiment of the present invention.

FIG. 11A depicts a top view of a semiconductor structure with a pad layer 210 formed on top of the semiconductor substrate 200 and a first mask layer 220 deposited on top of the pad layer formed in a line, in accordance with an embodiment of the present invention. As depicted FIG. 11A illustrates a section X1' on the top view of the semiconductor structure and a section Y' on the top view of the semiconductor structure.

Semiconductor substrate 200 is composed of any semiconductor substrate material suitable for forming one or more semiconductor devices with cross-bar fins. In various embodiments, semiconductor substrate 200 may be semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. III-V compound semiconductors may have a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). II-VI compound semiconductors may have a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In various embodiments, multiple layers of the semiconductor materials may be used as the semiconductor material of the semiconductor substrate 200. In some embodiments, the semiconductor substrate 200 includes both semiconductor materials and dielectric materials. The semiconductor substrate 200 may also comprise an organic semiconductor or a layered semiconductor such as, for example, Si/SiGe, a silicon-on-insulator or a SiGe-on-insulator. A portion the semiconductor substrate 200 or the entire semiconductor substrate 200 may be amorphous, polycrystalline, or monocrystalline. In addition to the aforementioned types of semiconductor substrates, the semiconductor substrate 200 employed in the present invention may also comprise a hybrid oriented (HOT) semiconductor substrate in which the HOT substrate has surface regions of different crystallographic orientation. The semiconductor substrate 200 may be doped, undoped or contain doped regions and undoped regions therein. The semiconductor substrate 200 may contain regions with strain and regions without strain therein, or contain regions of tensile strain and compressive strain. In some embodiments, the semiconductor substrate 200 includes other device structures (not shown) such as transistors, isolation structures (such as shallow trench isolations), contacts, conducting wires, etc.

In various embodiments, pad layer 210 is formed on top of the semiconductor substrate 200 using any method known in the art. In an embodiment, pad layer 210 is formed on top of semiconductor substrate 200 using atomic layer deposition (ALD). In an embodiment, pad layer 210 may consist of a material including, but not necessarily limited to, silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), siliconboron carbonitride (SiBCN), silicon oxycarbonitride (SiOCN), silicon oxide, titanium nitride (TiN) or any combination thereof. In an embodiment, pad layer 210 may be any thickness. In an embodiment, pad layer 210 may have a thickness in the range of 10 nanometers (nm) to 100 nm.

In various embodiments, first mask layer 220 is formed on top of the pad layer 210 using any method known in the art. In an embodiment, first mask layer 220 is formed on top of pad layer 210 by a deposition process followed by a patterning process. In an embodiment, first mask layer 220 is deposited by using chemical vapor deposition (CVD) followed by a patterning process using sidewall image transfer (SIT) to control the width in the Y direction of first mask layer 220. Any other suitable deposition and patterning techniques can be used. In an embodiment, first mask layer 220 may consist of a material including, but not necessarily limited to, silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), siliconboron carbonitride (SiBCN), silicon oxycarbonitride (SiOCN), silicon oxide, titanium nitride (TiN), or any combination thereof. In an embodiment, first mask layer 220 and pad layer 210 are not made from the same material. In an embodiment, first mask layer 220 may be any thickness. In an embodiment, first mask layer 220 may have a thickness in the range of 50 nm to 300 nm. In an embodiment, first mask layer 220 may be any width. In an embodiment, first mask layer 120 may be have a width in the range of 5 nm to 20 nm. While depicted as a single first mask layer 220, first mask layer 220 is not limited to a single first mask layer 220 and there may be any number.

Figure 11C:
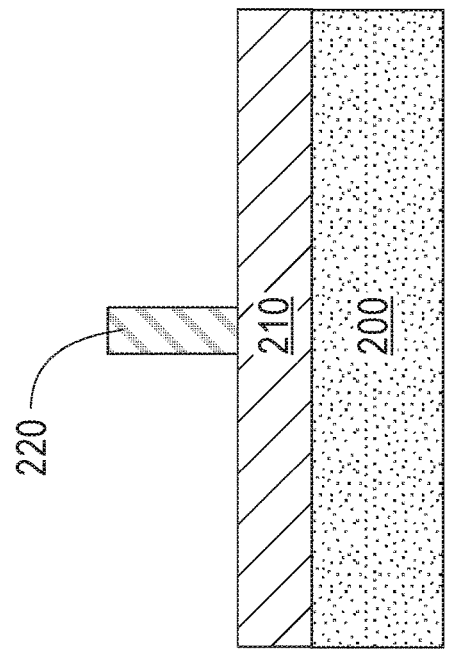
FIG. 11C depicts a cross-sectional view of section Y' of the semiconductor structure with a pad layer formed on top of the semiconductor substrate and a material layer deposited and patterned to form a line, in accordance with an embodiment of the present invention.
Figure 11B:
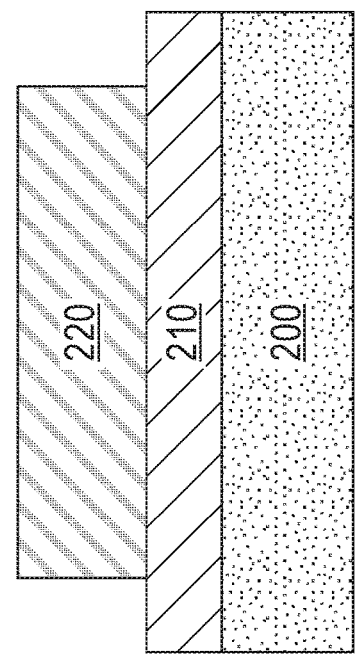
FIG. 11B depicts a cross-sectional view of section X1' of the semiconductor structure with a pad layer formed on top of the semiconductor substrate and a material layer deposited and patterned to form a line, in accordance with an embodiment of the present invention.

FIG. 11B depicts a cross-sectional view of the semiconductor structure along section X1', in accordance with an embodiment of the present invention. As depicted, FIG. 11B includes semiconductor substrate 200, pad layer 210, and first mask layer 220. FIG. 11C depicts a cross-sectional view of the semiconductor structure along section Y', in accordance with an embodiment of the present invention. As depicted, FIG. 1C includes semiconductor substrate 200, pad layer 210, and first mask layer 220.

FIG. 12A depicts a top view of a semiconductor structure after fabrication steps of forming of a first spacer layer 230 on top of the pad layer 210 illustrating locations of section X1' and section Y', in accordance with an embodiment of the present invention. In various embodiments, first spacer layer 230 may comprise amorphous silicon (aSi) or polycrystalline silicon. In various embodiments of the present invention, first spacer layer 230 is deposited on top of pad layer 210 and around first mask layer 220. In alternative embodiments of the present invention, spacer layer is deposited on top of pad layer 210 and around the exposed surfaces of first mask layer 220 (not shown), and reactive-ion etching is used as a direction etch that removes the first spacer layer 230 on the horizontal surfaces of first mask layer 220 while leaving first spacer layer 230 on the vertical sidewalls of first mask layer 220.

FIG. 12B depicts a cross-sectional view of section X1' of the semiconductor structure after fabrication steps of forming of a first spacer layer 230 on top of the pad layer 210, in accordance with an embodiment of the present invention. FIG. 12C depicts a cross-sectional view of section Y' of the semiconductor structure after fabrication steps of deposition of a first spacer layer 230 on top of the pad layer 210, in accordance with an embodiment of the present invention. As shown in FIGS. 12B and 12C, first spacer layer 230 is located on top of pad layer 210 and around the vertical sidewalls of first mask layer 220.

FIG. 13A depicts a top view of a semiconductor structure after fabrication steps of applying a cut masking layer 250 over the first mask layer 220 and the first spacer layer 230 illustrating locations of section X1' and section Y', in accordance with an embodiment of the present invention. In various embodiments, cut masking layer 250 covers the entirety of both first mask layer 220 and first spacer layer 230 in the Y direction, as shown in FIG. 13C. In various embodiments, cut masking layer 250 covers at least part of first mask layer 220 in the X direction, as shown in FIG. 12B. In various embodiment, the cut masking layer 250 may be a softmask layer (e.g., photoresist) or a hardmask layer (e.g., titanium nitride). In various embodiments, the cut masking layer 250 may be a single layer or may be multiple layers. In various embodiment, the cut masking layer 250 may be formed by lithography. In some embodiment, the cut masking layer 250 may be formed by lithography followed by patterning techniques known in the art.

FIG. 13B depicts a cross-sectional view of section X1' of the semiconductor structure after fabrication steps of applying a cut masking layer 250 over the first mask layer 220, in accordance with an embodiment of the present invention. As shown in FIG. 13B, cut masking layer 250 covers at least part of first mask layer 220 in the X direction. FIG. 13C depicts a cross-sectional view of section Y' of the semiconductor structure after fabrication steps of applying a cut masking layer 250 over the first mask layer 220 and the first spacer layer 230, in accordance with an embodiment of the present invention. As shown in FIG. 13C, cut masking layer 250 covers the entirety of both first mask layer 220 and first spacer layer 230 in the Y direction.

Figure 14C:
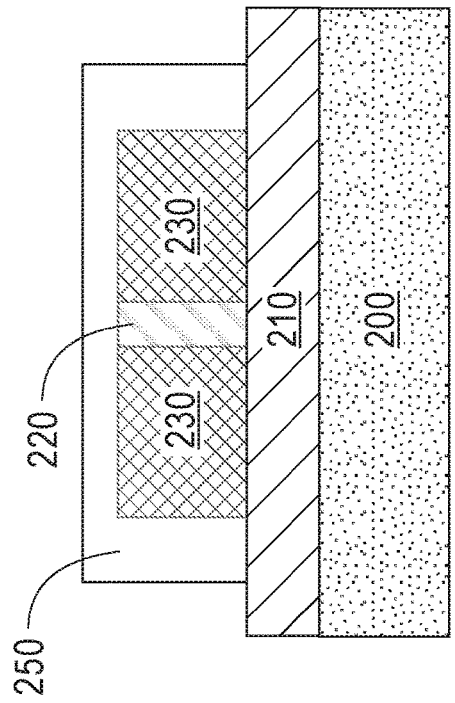
FIG. 14C depicts a cross-sectional view of section Y' of the semiconductor structure after fabrication steps of removing the material not covered by cut masking layer, in accordance with an embodiment of the present invention.
Figure 14D:
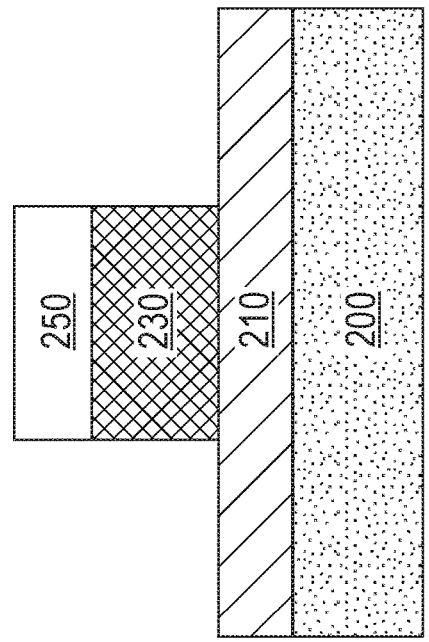
FIG. 14D depicts a cross-sectional view of section X2' of the semiconductor structure after fabrication steps of removing the material not covered by cut masking layer, in accordance with an embodiment of the present invention.
Figure 14A:
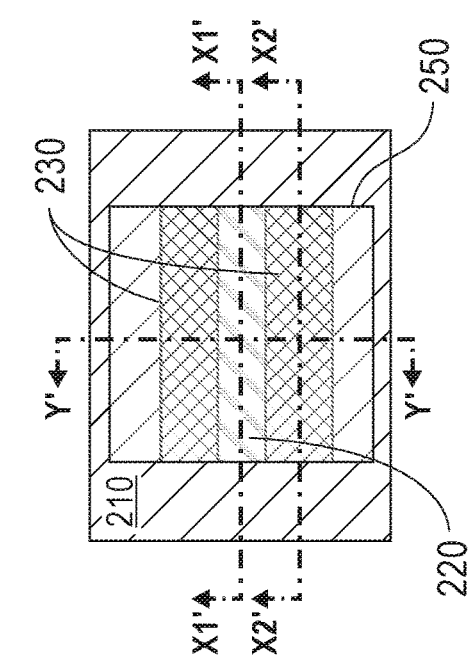
FIG. 14A depicts a top view of a semiconductor structure after fabrication steps of removing the material not covered by cut masking layer illustrating locations of section X1', section Y', and section X2', in accordance with an embodiment of the present invention.

FIG. 14A depicts a top view of a semiconductor structure after fabrication steps of removing the material not covered by cut masking layer 250 illustrating locations of section X1', section Y', and section X2', in accordance with an embodiment of the present invention. As shown in FIG. 14A, reactive-ion etching is used to remove first mask layer 220 and first spacer layer 230 not covered by cut masking layer 250. In various embodiment of this invention, a selective reactive-ion etch or plasma etch can be used to remove materials not covered by cut masking layer 250. In various embodiment of this invention, multiple etch processes can be used in combination to selective remove materials not covered by the cut masking layer 250.

Figure 14B:
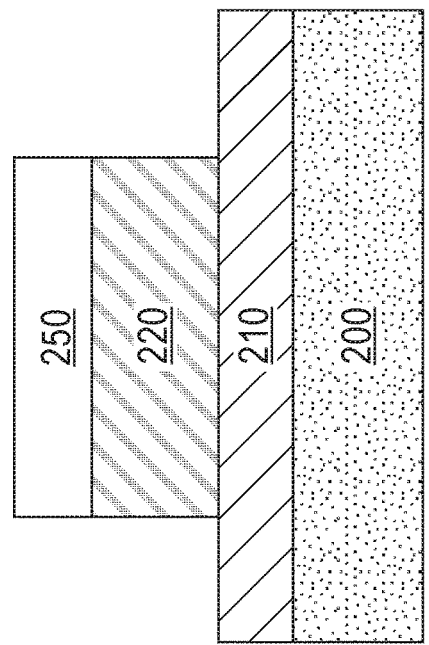
FIG. 14B depicts a cross-sectional view of section X1' of the semiconductor structure after fabrication steps of removing the material not covered by cut masking layer, in accordance with an embodiment of the present invention.

FIG. 14B depicts a cross-sectional view of section X1' of the semiconductor structure after fabrication steps of removing the material not covered by cut masking layer 250, in accordance with an embodiment of the present invention. As shown in FIG. 14B, first mask layer 220 and first spacer layer 230 that is not covered by cut masking layer 250 is removed using reactive-ion etching. FIG. 14C depicts a cross-sectional view of section Y' of the semiconductor structure after fabrication steps of removing the material not covered by cut masking layer 250, in accordance with an embodiment of the present invention. FIG. 14D depicts a cross-sectional view of section X2' of the semiconductor structure after fabrication steps of removing the material not covered by cut masking layer, in accordance with an embodiment of the present invention. As shown in FIG. 14D, first spacer layer 230 that is not covered by cut masking layer 250 is removed using reactive-ion etching.

Figure 15A:
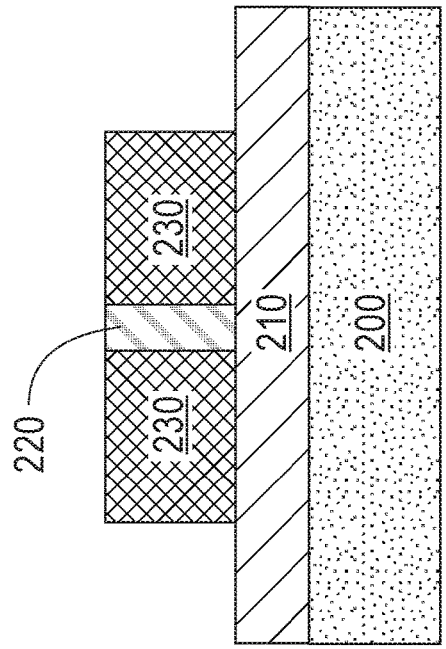
FIG. 15A depicts a top view of a semiconductor structure after fabrication steps of removing the cut masking layer illustrating locations of section X1', section Y', and section X2', in accordance with an embodiment of the present invention.

FIG. 15A depicts a top view of a semiconductor structure after fabrication steps of removing the cut masking layer 250 illustrating locations of section X1'. In embodiments of the invention, cut masking layer 250, when made as a photoresist layer, may be removed using an ashing process (e.g., oxygen plasma process). In alternative embodiments, cut masking layer 250 may be removed using any known process in the art such as a suitable etching process based on the type of cut masking layer 250.

Figure 15C:
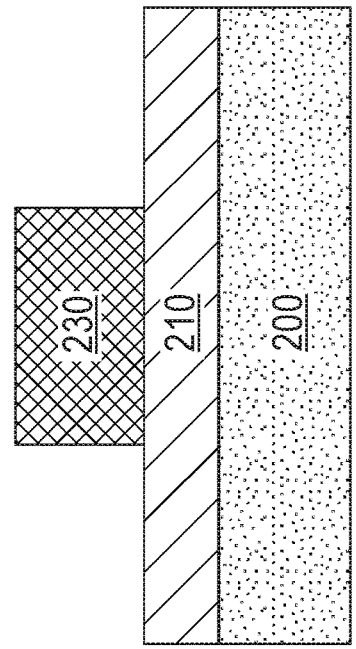
FIG. 15C depicts a cross-sectional view of section Y' of the semiconductor structure after fabrication steps of removing the cut masking layer, in accordance with an embodiment of the present invention.
Figure 15B:
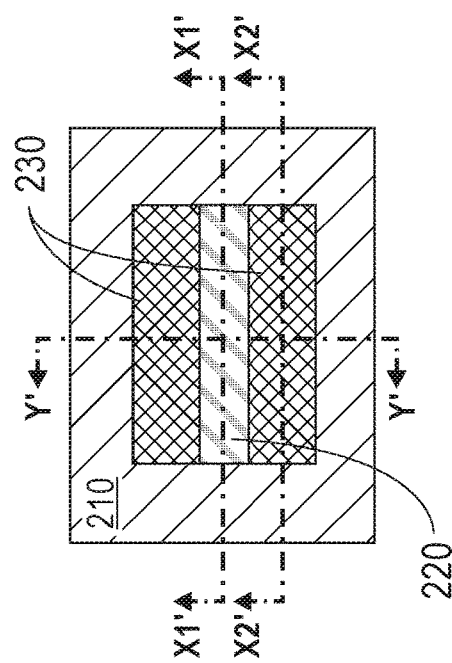
FIG. 15B depicts a cross-sectional view of section X1' of the semiconductor structure after fabrication steps of removing the cut masking layer, in accordance with an embodiment of the present invention.
Figure 15D:
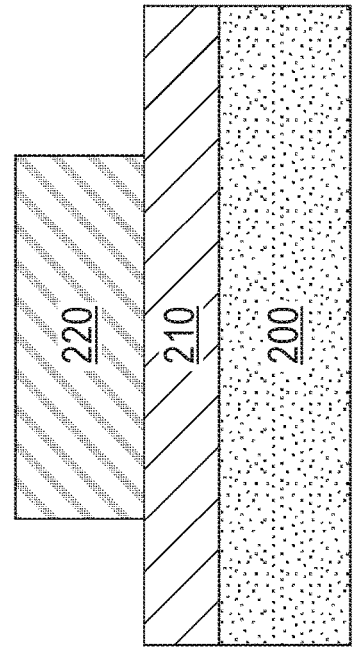
FIG. 15D depicts a cross-sectional view of section X2' of the semiconductor structure after fabrication steps of removing the cut masking layer, in accordance with an embodiment of the present invention.

FIG. 15B depicts a cross-sectional view of section X1' of the semiconductor structure after fabrication steps of removing the cut masking layer 250, in accordance with an embodiment of the present invention. FIG. 15C depicts a cross-sectional view of section Y' of the semiconductor structure after fabrication steps of removing the cut masking layer 250, in accordance with an embodiment of the present invention. FIG. 15D depicts a cross-sectional view of section X2' of the semiconductor structure after fabrication steps of removing the cut masking layer 250, in accordance with an embodiment of the present invention.

Figure 16A:
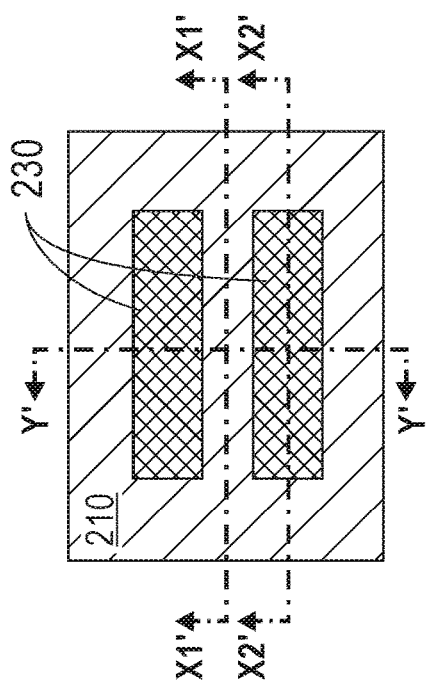
FIG. 16A depicts a top view of a semiconductor structure after fabrication steps of selectively removing the material layer illustrating locations of section X1', section Y', and section X2', in accordance with an embodiment of the present invention.
Figure 16B:
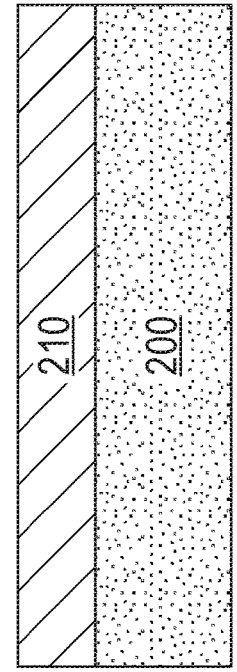
FIG. 16B depicts a cross-sectional view of section X1' of the semiconductor structure after fabrication steps of selectively removing the material layer, in accordance with an embodiment of the present invention.
Figure 16C:
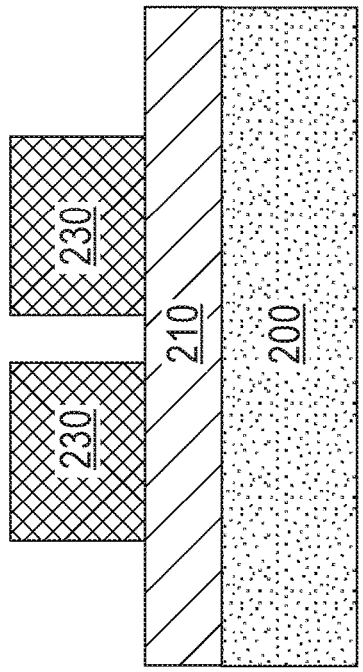
FIG. 16C depicts a cross-sectional view of section Y' of the semiconductor structure after fabrication steps of selectively removing the material layer, in accordance with an embodiment of the present invention.
Figure 16D:
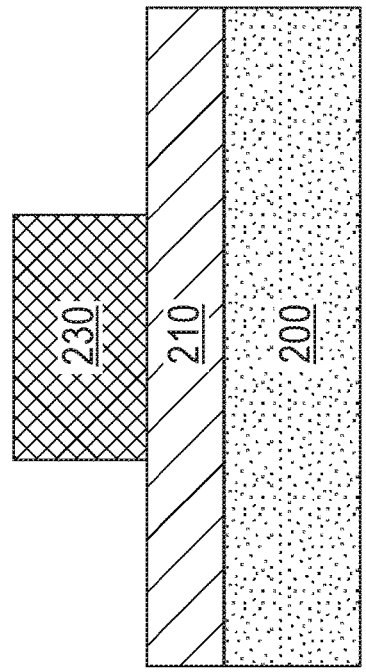
FIG. 16D depicts a cross-sectional view of section X2' of the semiconductor structure after fabrication steps of selectively removing the material layer, in accordance with an embodiment of the present invention.

FIG. 16A depicts a top view of a semiconductor structure after fabrication steps of selectively removing the first mask layer 220 illustrating locations of section X1', section Y', and section X2', in accordance with an embodiment of the present invention. In embodiments of the present invention, first mask layer 220 is removed using heated SC1 ($NH_4OH$:$H_2O_2$:$H_2O$) solution. FIG. 16B depicts a cross-sectional view of section X1' of the semiconductor structure after fabrication steps of selectively removing the first mask layer 220, in accordance with an embodiment of the present invention. FIG. 16C depicts a cross-sectional view of section Y' of the semiconductor structure after fabrication steps of selectively removing the first mask layer 220, in accordance with an embodiment of the present invention. FIG. 16D depicts a cross-sectional view of section X2' of the semiconductor structure after fabrication steps of selectively removing the first mask layer 220, in accordance with an embodiment of the present invention. In an embodiment, selectively removing the first mask layer 220 creates a gap in the first spacer layer 230.

Figure 17A:
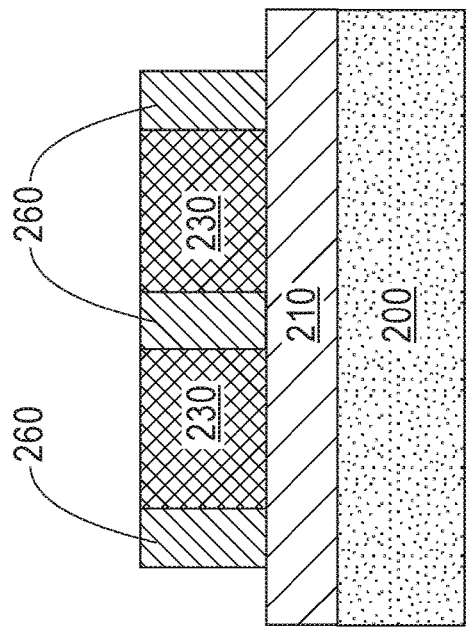
FIG. 17A depicts a top view of a semiconductor structure after fabrication steps of depositing a spacer material illustrating locations of section X1', section Y', and section X2', in accordance with an embodiment of the present invention.

FIG. 17A depicts a top view of a semiconductor structure after fabrication steps of forming a second spacer layer 260 illustrating locations of section X1', section Y', and section X2', in accordance with an embodiment of the present invention. In various embodiments of the present invention, second spacer layer 260 (e.g., $SiO_2$, SiN, SiON, SiOC, SiOCN, etc.) is deposited with a lateral width similar to the lateral width of the previously removed first mask layer 220. In various embodiments of the present invention, second spacer layer 260 pinches the gap between first spacer layer 230. In various embodiment, the deposition thickness of the second spacer layer 260 is chosen as what is substantially the same as the thickness of the spacer material 220, resulting in a spacer material with a same lateral width for all segments relative to first spacer layer 230, as discussed below.

Figure 17C:
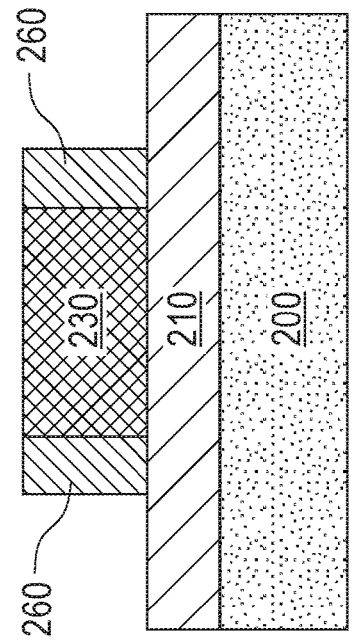
FIG. 17C depicts a cross-sectional view of section Y' of the semiconductor structure after fabrication steps of depositing a spacer material, in accordance with an embodiment of the present invention.
Figure 17B:
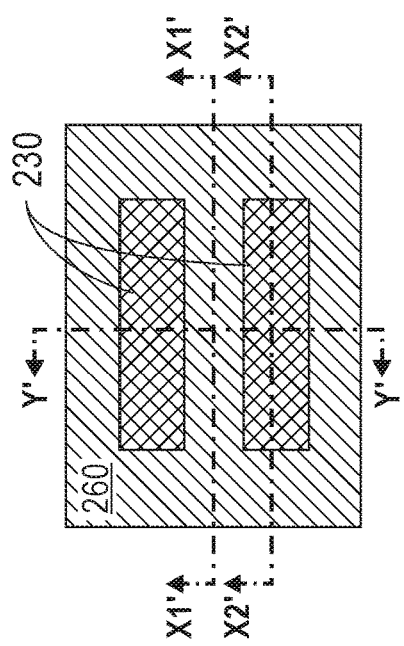
FIG. 17B depicts a cross-sectional view of section X1' of the semiconductor structure after fabrication steps of depositing a spacer material, in accordance with an embodiment of the present invention.
Figure 17D:
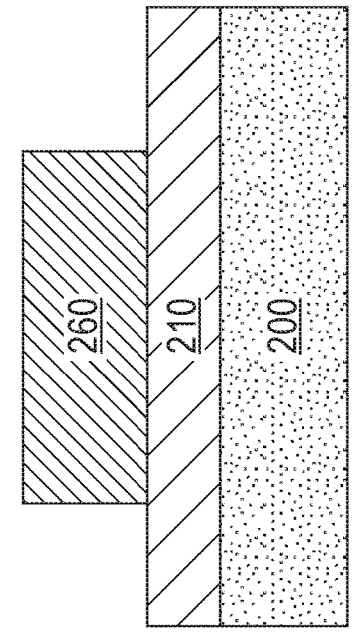
FIG. 17D depicts a cross-sectional view of section X2' of the semiconductor structure after fabrication steps of depositing a spacer material, in accordance with an embodiment of the present invention.

FIG. 17B depicts a cross-sectional view of section X1' of the semiconductor structure after fabrication steps of depositing a second spacer layer 260, in accordance with an embodiment of the present invention. FIG. 17C depicts a cross-sectional view of section Y' of the semiconductor structure after fabrication steps of depositing a second spacer layer 260, in accordance with an embodiment of the present invention. In various embodiments of the present invention, as shown in FIG. 17C, the lateral width of second spacer layer 260 is the same for all segments of second spacer layer 260. FIG. 17D depicts a cross-sectional view of section X2' of the semiconductor structure after fabrication steps of depositing a second spacer layer 260, in accordance with an embodiment of the present invention. In various embodiments of the present invention, as shown in FIG. 17D, the lateral width of second spacer layer 260 is the same for all segments of second spacer layer 260.

Figure 18C:
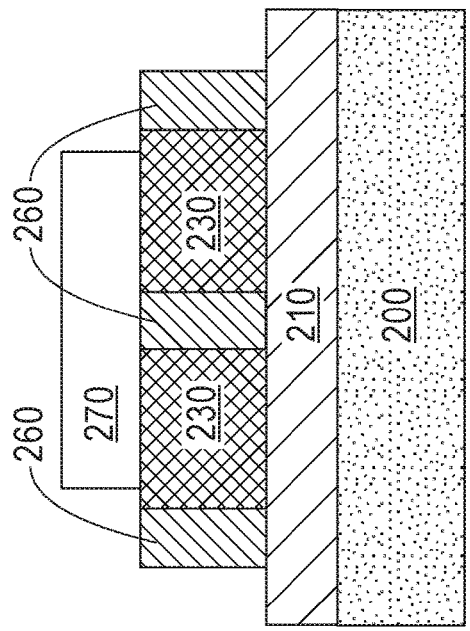
FIG. 18C depicts a cross-sectional view of section Y' of the semiconductor structure after fabrication steps of applying a cut masking layer over the spacer material layers, in accordance with an embodiment of the present invention.
Figure 18D:
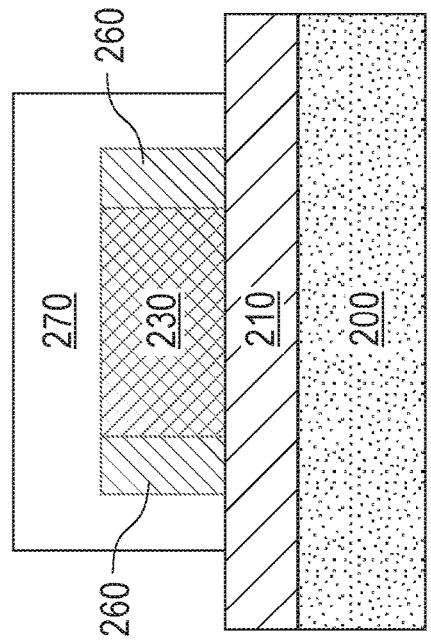
FIG. 18D depicts a cross-sectional view of section X2' of the semiconductor structure after fabrication steps of applying a cut masking layer over the spacer material layers, in accordance with an embodiment of the present invention.
Figure 18A:
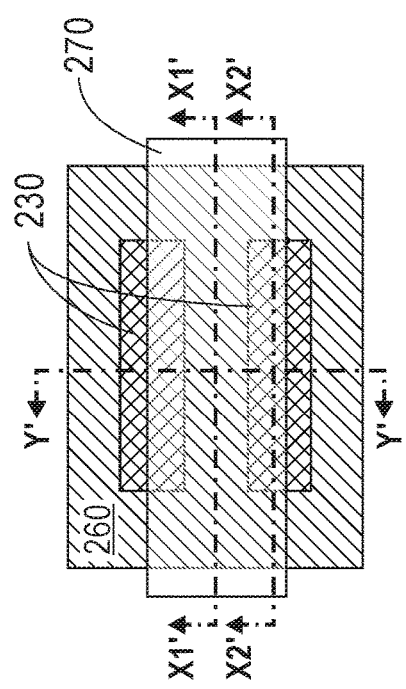
FIG. 18A depicts a top view of a semiconductor structure after fabrication steps of applying a cut masking layer over the spacer material layers illustrating locations of section X1', section Y', and section X2', in accordance with an embodiment of the present invention.
Figure 18B:
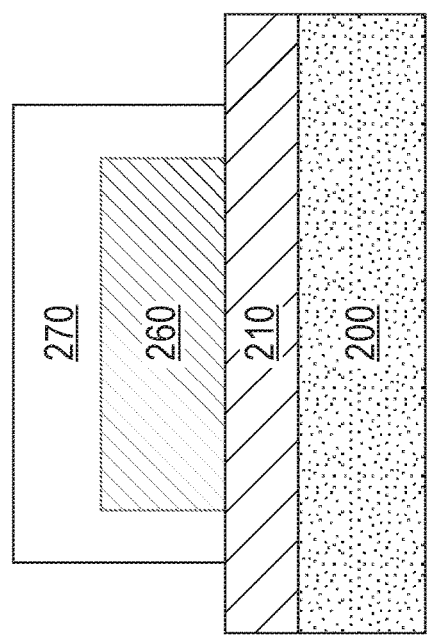
FIG. 18B depicts a cross-sectional view of section X1' of the semiconductor structure after fabrication steps of applying a cut masking layer over the spacer material layers, in accordance with an embodiment of the present invention.

FIG. 18A depicts a top view of a semiconductor structure after fabrication steps of forming a cut masking layer 270 over the first spacer layer 230 and second spacer layer 260 illustrating locations of section X1', section Y', and section X2', in accordance with an embodiment of the present invention. In various embodiments, cut masking layer 270 covers the entirety of both first mask layer 220 and first spacer layer 230 in the X direction, as shown in FIGS. 18B and 18D. In various embodiments, cut masking layer 270 covers at least part of first spacer layer 230 and second spacer layer 260 in the Y direction, as shown in FIG. 18C. In various embodiment, the cut masking layer 270 may be a softmask layer (e.g., photoresist) or a hardmask layer (e.g., titanium nitride). In various embodiments, the cut masking layer 270 may be a single layer or may be multiple layers. In various embodiment, the cut masking layer 270 may be formed by lithography. In some embodiment, the cut masking layer 270 may be formed by lithography followed by patterning techniques known in the art.

FIG. 18B depicts a cross-sectional view of section X1' of the semiconductor structure after fabrication steps of applying a cut masking layer 270 over the first spacer layer 230 and second spacer layer 260, in accordance with an embodiment of the present invention. As shown in FIG. 18B, cut masking layer 270 covers the entirety of both first mask layer 220 and first spacer layer 230 in the X direction. FIG. 18C depicts a cross-sectional view of section Y' of the semiconductor structure after fabrication steps of applying a cut masking layer 270 over the first spacer layer 230 and second spacer layer 260, in accordance with an embodiment of the present invention. As shown in FIG. 13C, cut masking layer 270 covers at least part of first spacer layer 230 and second spacer layer 260 in the Y direction. FIG. 18D depicts a cross-sectional view of section X2' of the semiconductor structure after fabrication steps of applying a cut masking layer 270 over the first spacer layer 230 and second spacer layer 260, in accordance with an embodiment of the present invention. As shown in FIG. 18D, cut masking layer 270 covers the entirety of both first mask layer 220 and first spacer layer 230 in the X direction.

Figure 19A:
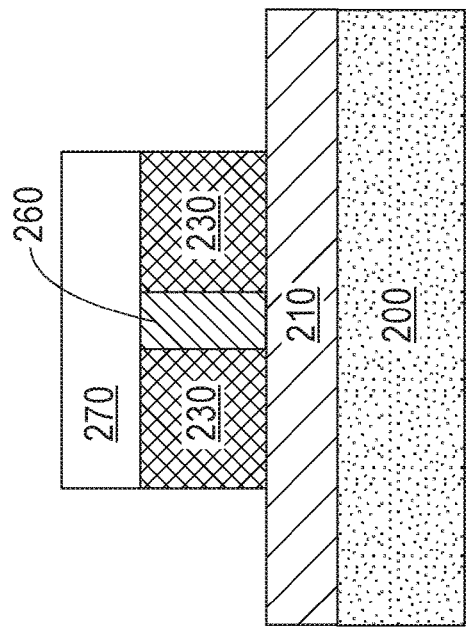
FIG. 19A depicts a top view of a semiconductor structure after fabrication steps of selectively removing spacer material not covered by the cut masking layer illustrating locations of section X1', section Y', and section X2', in accordance with an embodiment of the present invention.

FIG. 19A depicts a top view of a semiconductor structure after fabrication steps of selectively removing first spacer layer 230 and second spacer layer 260 not covered by the cut masking layer 270 illustrating locations of section X1', section Y', and section X2', in accordance with an embodiment of the present invention. In various embodiment of this invention, a selective reactive-ion etch or plasma etch can be used to remove materials not covered by the cut masking layer 270. In various embodiment of this invention, multiple etch processes, known in the art, can be used in combination to selective remove materials not covered by the cut masking layer 270.

Figure 19B:
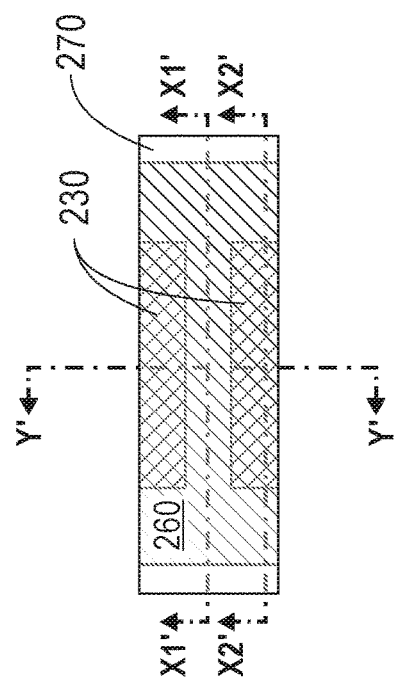
FIG. 19B depicts a cross-sectional view of section X1' of the semiconductor structure after steps of selectively removing spacer material not covered by the cut masking layer, in accordance with an embodiment of the present invention.
Figure 19C:
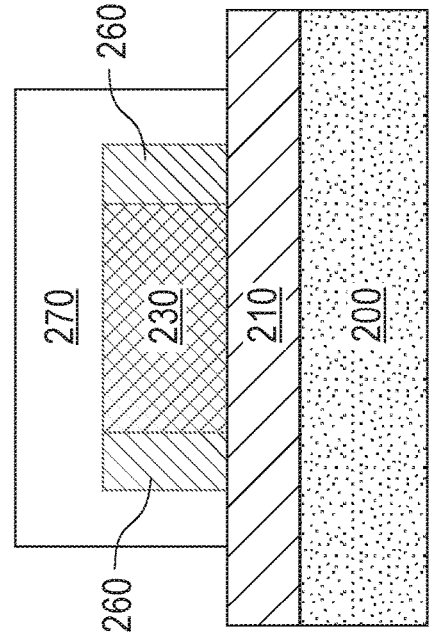
FIG. 19C depicts a cross-sectional view of section Y' of the semiconductor structure after fabrication steps of selectively removing spacer material not covered by the cut masking layer, in accordance with an embodiment of the present invention.
Figure 19D:
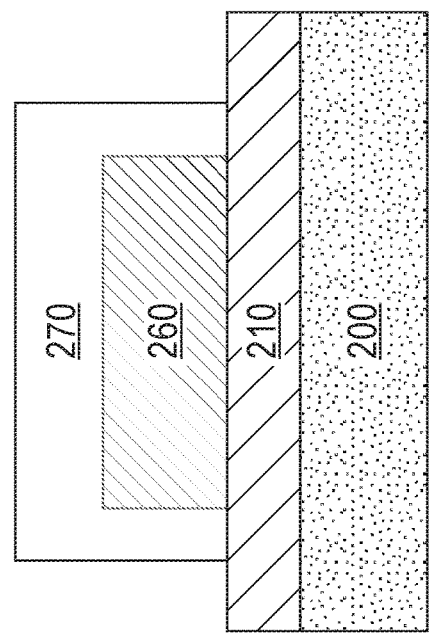
FIG. 19D depicts a cross-sectional view of section X2' of the semiconductor structure after fabrication steps of selectively removing spacer material not covered by the cut masking layer, in accordance with an embodiment of the present invention.

FIG. 19B depicts a cross-sectional view of section X1' of the semiconductor structure after steps of selectively removing first spacer layer 230 and second spacer layer 260 not covered by the cut masking layer 270, in accordance with an embodiment of the present invention. FIG. 19C depicts a cross-sectional view of section Y' of the semiconductor structure after fabrication steps of selectively removing first spacer layer 230 and second spacer layer 260 not covered by the cut masking layer 270, in accordance with an embodiment of the present invention. FIG. 19D depicts a cross-sectional view of section X2' of the semiconductor structure after fabrication steps of selectively removing first spacer layer 230 and second spacer layer 260 not covered by the cut masking layer 270, in accordance with an embodiment of the present invention.

Figure 20A:
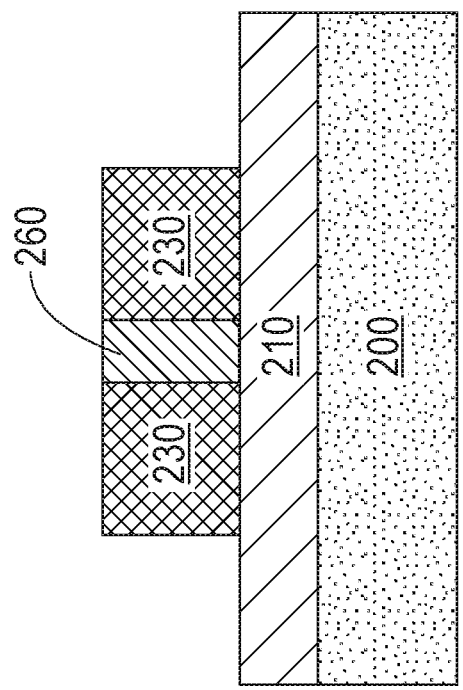
FIG. 20A depicts a top view of a semiconductor structure after fabrication steps of removing the cut masking layer illustrating locations of section X1', section Y', and section X2', in accordance with an embodiment of the present invention.

FIG. 20A depicts a top view of a semiconductor structure after fabrication steps of removing the cut masking layer 270 illustrating locations of section X1', section Y', and section X2', in accordance with an embodiment of the present invention. In embodiments of the invention, cut masking layer 270, when made as a photoresist layer, may be removed using an ashing process (e.g., oxygen plasma process). In alternative embodiments, cut masking layer 270 may be removed using any known process in the art such as a suitable etching process based on the type of cut masking layer 270.

Figure 20C:
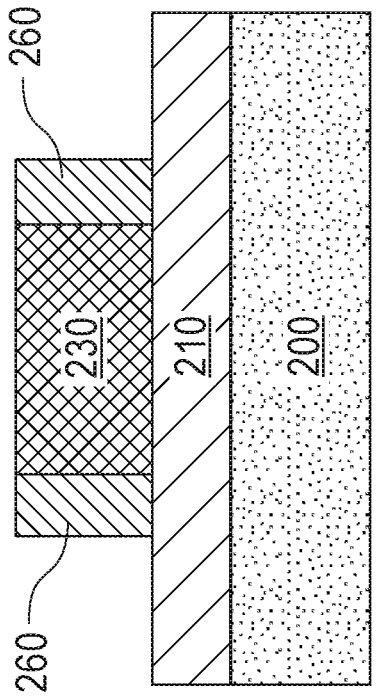
FIG. 20C depicts a cross-sectional view of section Y' of the semiconductor structure after fabrication steps of removing the cut masking layer, in accordance with an embodiment of the present invention.
Figure 20B:
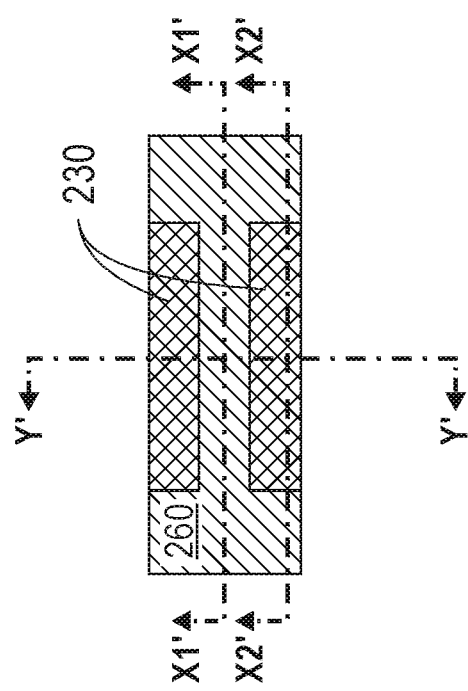
FIG. 20B depicts a cross-sectional view of section X1' of the semiconductor structure after steps of removing the cut masking layer, in accordance with an embodiment of the present invention.
Figure 20D:
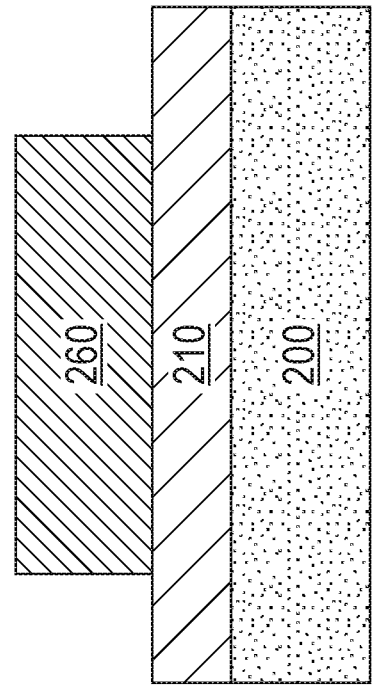
FIG. 20D depicts a cross-sectional view of section X2' of the semiconductor structure after fabrication steps of removing the cut masking layer, in accordance with an embodiment of the present invention.

FIG. 20B depicts a cross-sectional view of section X1' of the semiconductor structure after steps of removing the cut masking layer 270, in accordance with an embodiment of the present invention. FIG. 20C depicts a cross-sectional view of section Y' of the semiconductor structure after fabrication steps of removing the cut masking layer 270, in accordance with an embodiment of the present invention. FIG. 20D depicts a cross-sectional view of section X2' of the semiconductor structure after fabrication steps of removing the cut masking layer 270, in accordance with an embodiment of the present invention.

Figure 21C:
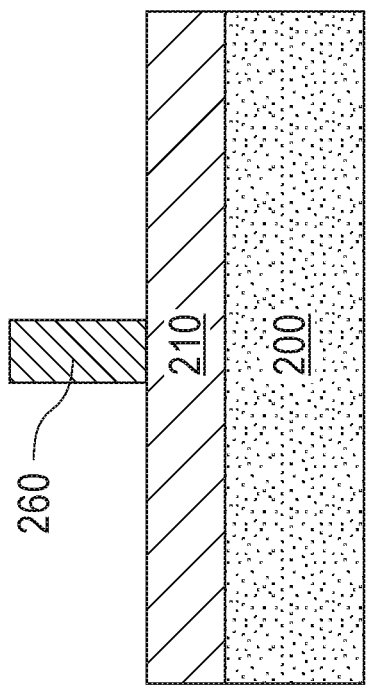
FIG. 21C depicts a cross-sectional view of section Y' of the semiconductor structure after fabrication steps of selectively removing the spacer layer, in accordance with an embodiment of the present invention.
Figure 21D:
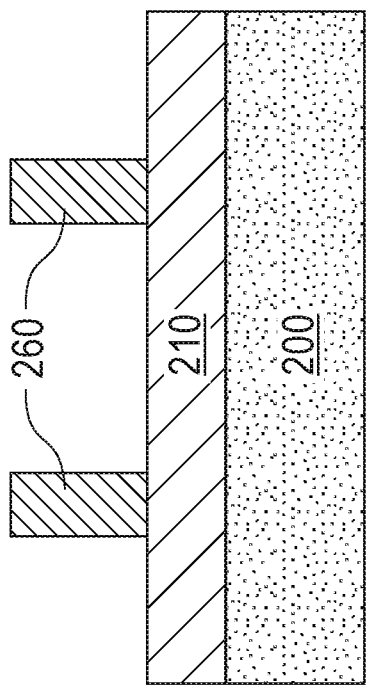
FIG. 21D depicts a cross-sectional view of section X2' of the semiconductor structure after fabrication steps of selectively removing the spacer layer, in accordance with an embodiment of the present invention.
Figure 21A:
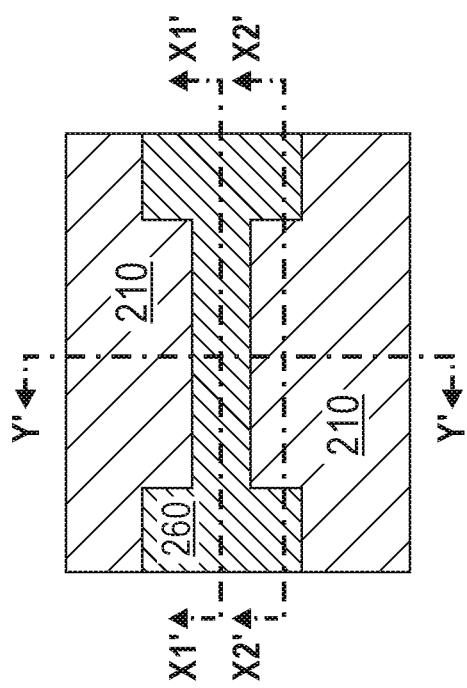
FIG. 21A depicts a top view of a semiconductor structure after fabrication steps of selectively removing the spacer layer illustrating locations of section X1', section Y', and section X2', in accordance with an embodiment of the present invention.
Figure 21B:
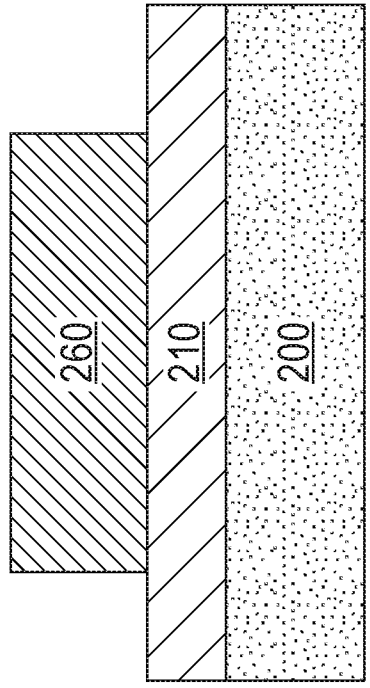
FIG. 21B depicts a cross-sectional view of section X1' of the semiconductor structure after steps of selectively removing the spacer layer, in accordance with an embodiment of the present invention.

FIG. 21A depicts a top view of a semiconductor structure after fabrication steps of selectively removing the first spacer layer 230 illustrating locations of section X1', section Y', and section X2', in accordance with an embodiment of the present invention. In embodiments of the present invention, first spacer layer 230 is removed using heated SC1 ($NH_4OH:H_2O_2:H_2O$) solution. FIG. 21B depicts a cross-sectional view of section X1' of the semiconductor structure after steps of selectively removing the first spacer layer 230, in accordance with an embodiment of the present invention. FIG. 21C depicts a cross-sectional view of section Y' of the semiconductor structure after fabrication steps of selectively removing the first spacer layer 230, in accordance with an embodiment of the present invention. FIG. 21D depicts a cross-sectional view of section X2' of the semiconductor structure after fabrication steps of selectively removing the first spacer layer 230, in accordance with an embodiment of the present invention.

Figure 22A:
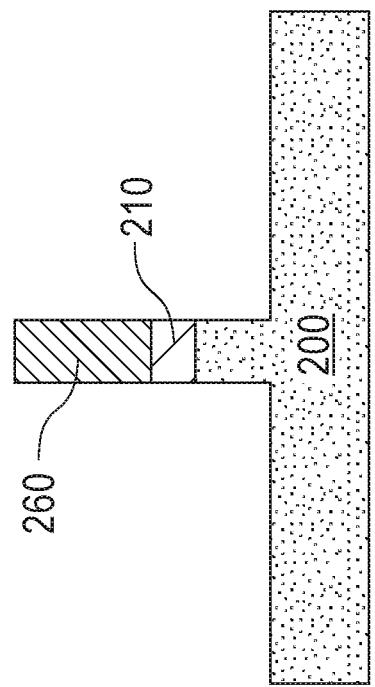
FIG. 22A depicts a top view of a semiconductor structure after fabrication steps of transferring the pattern into the pad layer and semiconductor structure illustrating locations of section X1', section Y', and section X2', in accordance with an embodiment of the present invention.
Figure 22C:
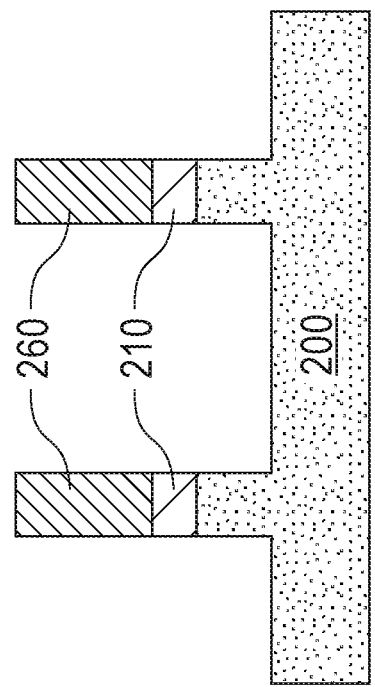
FIG. 22C depicts a cross-sectional view of section Y' of the semiconductor structure after fabrication steps of transferring the pattern into the pad layer and semiconductor structure, in accordance with an embodiment of the present invention.
Figure 22B:
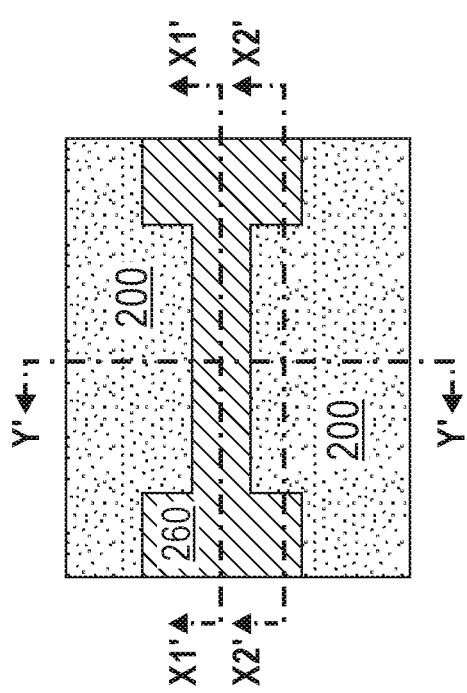
FIG. 22B depicts a cross-sectional view of section X1' of the semiconductor structure after steps of transferring the pattern into the pad layer and semiconductor structure, in accordance with an embodiment of the present invention.
Figure 22D:
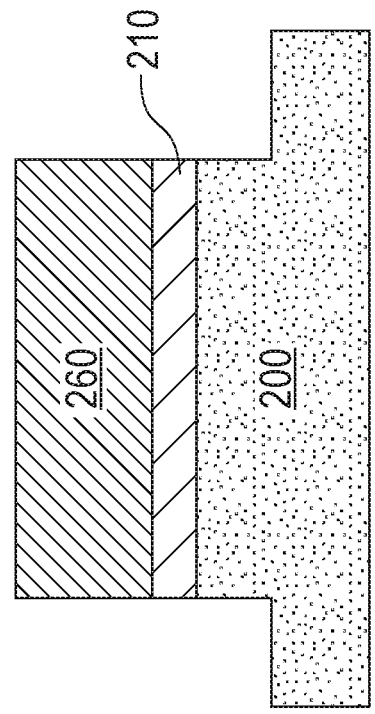
FIG. 22D depicts a cross-sectional view of section X2' of the semiconductor structure after fabrication steps of transferring the pattern into the pad layer and semiconductor structure, in accordance with an embodiment of the present invention.

FIG. 22A depicts a top view of a semiconductor structure after fabrication steps of transferring the pattern into the pad layer 210 and semiconductor structure 200 illustrating locations of section X1', section Y', and section X2', in accordance with an embodiment of the present invention. In various embodiments, the pattern formed by the remaining second spacer layer 260 is transferred into the pad layer 210 and semiconductor substrate 200 using reactive-ion etching to form the fins. FIG. 22B depicts a cross-sectional view of section X1' of the semiconductor structure after steps of transferring the pattern into the pad layer 210 and semiconductor structure 200, in accordance with an embodiment of the present invention. FIG. 22C depicts a cross-sectional view of section Y' of the semiconductor structure after fabrication steps of transferring the pattern into the pad layer 210 and semiconductor structure 200, in accordance with an embodiment of the present invention. FIG. 22D depicts a cross-sectional view of section X2' of the semiconductor structure after fabrication steps of transferring the pattern into the pad layer 210 and semiconductor structure 200, in accordance with an embodiment of the present invention.

Figure 23C:
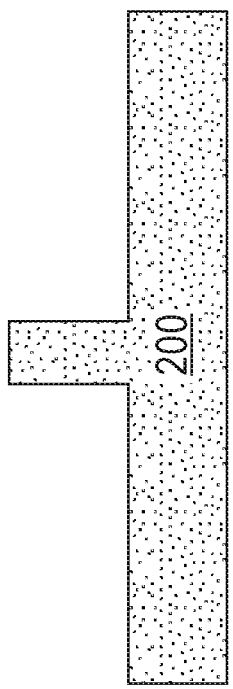
FIG. 23C depicts a cross-sectional view of section Y' of the semiconductor structure after fabrication steps of removing the remaining spacer material and pad layer, in accordance with an embodiment of the present invention.
Figure 23D:
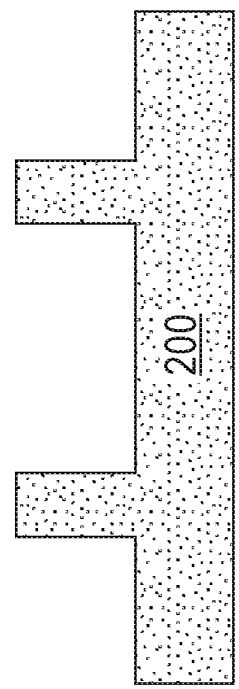
FIG. 23D depicts a cross-sectional view of section X2' of the semiconductor structure after fabrication steps of removing the remaining spacer material and pad layer, in accordance with an embodiment of the present invention.
Figure 23A:
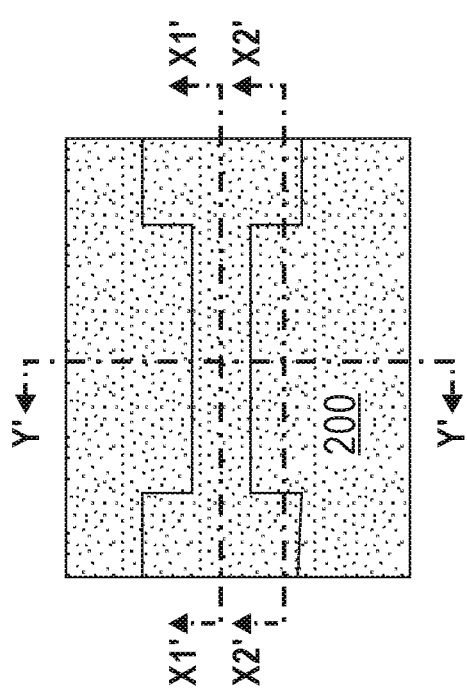
FIG. 23A depicts a top view of a semiconductor structure after fabrication steps of removing the remaining spacer material and pad layer illustrating locations of section X1', section Y', and section X2', in accordance with an embodiment of the present invention.
Figure 23B:
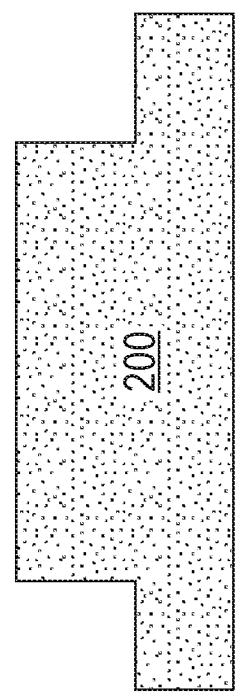
FIG. 23B depicts a cross-sectional view of section X1' of the semiconductor structure after steps of removing the remaining spacer material and pad layer, in accordance with an embodiment of the present invention.

FIG. 23A depicts a top view of a semiconductor structure after fabrication steps of removing the remaining second spacer layer 260 and pad layer 210 illustrating locations of section X1', section Y', and section X2', in accordance with an embodiment of the present invention. In various embodiments of the present invention, second spacer layer 260 and pad layer 210 may be removed using any suitable process known in the art. FIG. 23B depicts a cross-sectional view of section X1' of the semiconductor structure after steps of removing the remaining second spacer layer 260 and pad layer 210, in accordance with an embodiment of the present invention. FIG. 23C depicts a cross-sectional view of section Y' of the semiconductor structure after fabrication steps of removing the remaining second spacer layer 260 and pad layer 210, in accordance with an embodiment of the present invention. FIG. 23D depicts a cross-sectional view of section X2' of the semiconductor structure after fabrication steps of removing the remaining second spacer layer 260 and pad layer 210, in accordance with an embodiment of the present invention.

Figure 24A:
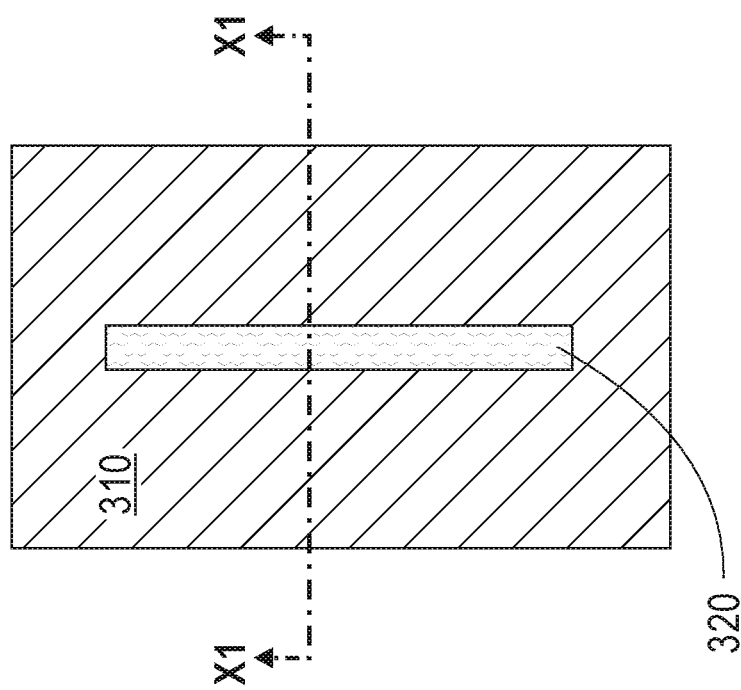
FIG. 24A depicts a top view of a semiconductor structure with a pad layer formed on top of the semiconductor substrate and a mandrel material deposited and patterned to form a line illustrating locations of section X1", in accordance with an embodiment of the present invention.
Figure 24B:
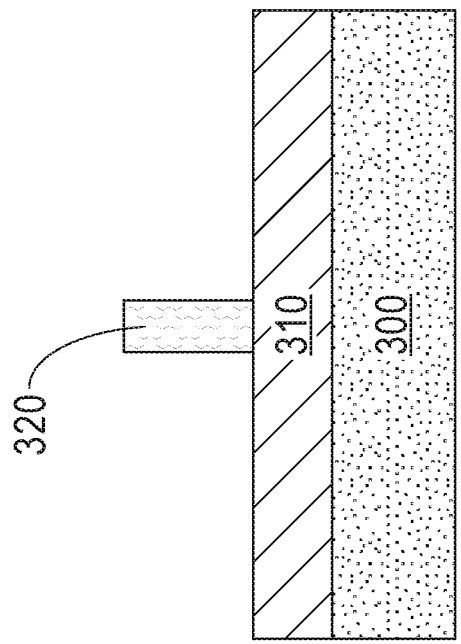
FIG. 24B depicts a cross-sectional view of section X1" of the semiconductor structure after fabrication steps of forming a pad layer on top of the semiconductor substrate and a mandrel material deposited and patterned to form a line, in accordance with an embodiment of the present invention.

FIG. 24A depicts a top view of a semiconductor structure with a pad layer 310 formed on top of the semiconductor substrate 300 and a mandrel material 320 deposited and patterned to form a line, in accordance with an embodiment of the present invention. As depicted, FIG. 24A illustrates locations of section X1", in accordance with an embodiment of the present invention.

Semiconductor substrate 300 is composed of any semiconductor substrate material suitable for forming one or more semiconductor devices with cross-bar fins. In various embodiments, semiconductor substrate 300 may be semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. III-V compound semiconductors may have a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). II-VI compound semiconductors may have a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In various embodiments, multiple layers of the semiconductor materials may be used as the semiconductor material of the semiconductor substrate 300. In some embodiments, the semiconductor substrate 300 includes both semiconductor materials and dielectric materials. The semiconductor substrate 300 may also comprise an organic semiconductor or a layered semiconductor such as, for example, Si/SiGe, a silicon-on-insulator or a SiGe-on-insulator. A portion the semiconductor substrate 300 or the entire semiconductor substrate 300 may be amorphous, polycrystalline, or monocrystalline. In addition to the aforementioned types of semiconductor substrates, the semiconductor substrate 300 employed in the present invention may also comprise a hybrid oriented (HOT) semiconductor substrate in which the HOT substrate has surface regions of different crystallographic orientation. The semiconductor substrate 300 may be doped, undoped or contain doped regions and undoped regions therein. The semiconductor substrate 300 may contain regions with strain and regions without strain therein, or contain regions of tensile strain and compressive strain. In some embodiments, the semiconductor substrate 300 includes other device structures (not shown) such as transistors, isolation structures (such as shallow trench isolations), contacts, conducting wires, etc.

In various embodiments, pad layer 310 is formed on top of the semiconductor substrate 300 using any method known in the art. In an embodiment, pad layer 310 is formed on top of semiconductor substrate 300 using atomic layer deposition (ALD). In an embodiment, pad layer 310 may consist of a material including, but not necessarily limited to, silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), siliconboron carbonitride (SiBCN), silicon oxycarbonitride (SiOCN), silicon oxide, titanium nitride (TiN) or any combination thereof. In an embodiment, pad layer 310 may be any thickness. In an embodiment, pad layer 310 may have a thickness in the range of 10 nanometers (nm) to 100 nm.

In embodiments of the present invention, mandrel material 320 is formed as a "stripe" in a patterning process. In alternative embodiment of the present invention, mandrel material 320 may be formed as multiple "stripes" (not shown). In an embodiment, mandrel material 320 may be formed using direct patterning and/or sidewall image transfer. In an embodiment, mandrel material 320 may consist of a material including, but not necessarily limited to, amorphous silicon (aSi), polycrystalline silicon, amorphous silicon germanium (aSiGe), polycrystalline silicon germanium, or any combination thereof. In some embodiments, a planarization process (e.g., chemical mechanical polishing (CMP)) may be performed after deposition of mandrel material 320. In an embodiment, mandrel material 320 may be any thickness. In an embodiment, mandrel material 320 may have a thickness in the range of 10 nm to 100 nm. In an embodiment, mandrel material 320 may have a width in the range of 10 nm to 50 nm. Not essential. Exemplary range: 10 nm to 50 nm. In an embodiment, the mandrel material 320 comprises aSiGe deposited by CVD process, planarized by CMP process, and patterned by sidewall image transfer (SIT) process.

Figure 25B:
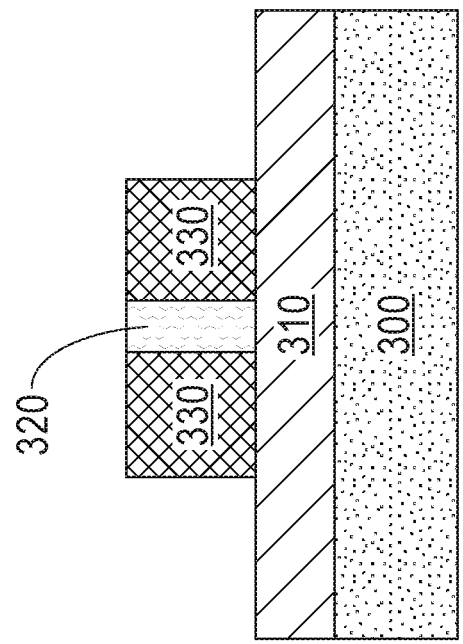
FIG. 25B depicts a cross-sectional view of section X1" of the semiconductor structure after fabrication steps of depositing a first spacer material on top of the pad layer and around the mandrel material, in accordance with an embodiment of the present invention.
Figure 25A:
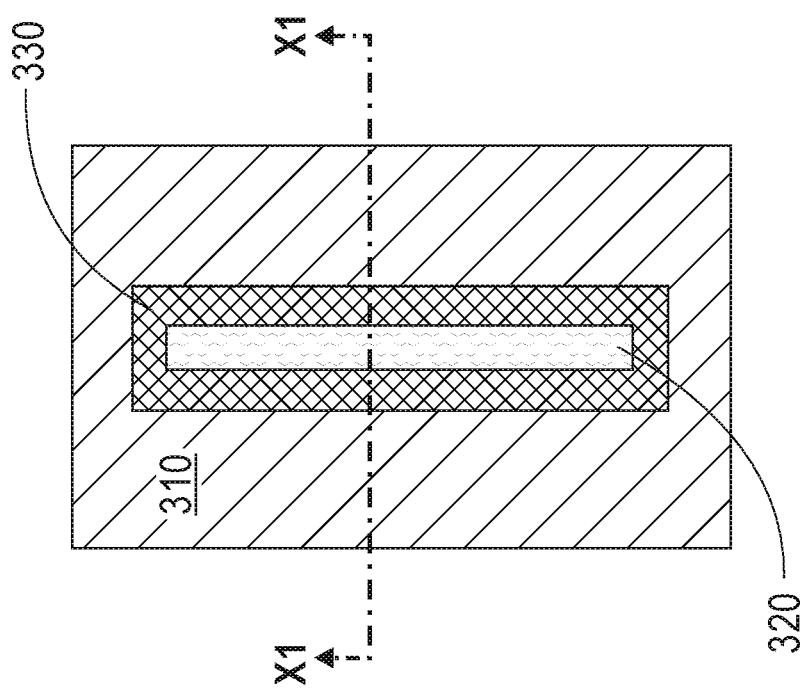
FIG. 25A depicts a top view of a semiconductor structure after fabrication steps of depositing a first spacer material on top of the pad layer and around the mandrel material illustrating locations of section X1", in accordance with an embodiment of the present invention.

FIG. 25A depicts a top view of a semiconductor structure after fabrication steps of depositing a first spacer material 330 on top of the pad layer 310 and around the mandrel material 320 illustrating locations of section X1", in accordance with an embodiment of the present invention. In embodiments of the present invention, first spacer material 330 may consist of amorphous silicon (aSi). In alternative embodiments of the present invention, first pacer material may be made of polycrystalline Si. In various embodiments, first spacer layer 330 is formed around the mandrel material 320 using selective deposition. In some embodiments, a reactive-ion etching may be performed after deposition of first space material 330 to fabricate first spacer material 330 to have a vertical thickness substantially the same as mandrel material 320. FIG. 25B depicts a cross-sectional view of section X1" of the semiconductor structure after fabrication steps of depositing a first spacer material 330 on top of the pad layer 310 and around the mandrel material 320, in accordance with an embodiment of the present invention.

FIG. 26A depicts a top view of a semiconductor structure after fabrication steps of applying a cut masking layer 340 over the pad layer 310 covering the mandrel material 320 and first spacer material 330 illustrating locations of section X1", in accordance with an embodiment of the present invention. In various embodiments, cut masking layer 340 covers the entirety of both mandrel material 320 and first spacer material 330 in the X direction, as shown in FIG. 26B. In various embodiments, cut masking layer 340 covers at least part of both mandrel material 320 and first spacer material 330 in the Y direction, as shown in FIG. 26B. In various embodiment, the cut masking layer 340 may be a softmask layer (e.g., photoresist) or a hardmask layer (e.g., titanium nitride). In various embodiments, the cut masking layer 340 may be a single layer or may be multiple layers. In various embodiment, the cut masking layer 340 may be formed by lithography. In some embodiment, the cut masking layer 340 may be formed by lithography followed by patterning techniques known in the art. FIG. 26B depicts a cross-sectional view of section X1" of the semiconductor structure after fabrication steps of applying a cut masking layer 340 over the pad layer 310 covering the mandrel material 320 and first spacer material 330, in accordance with an embodiment of the present invention.

Figure 27B:
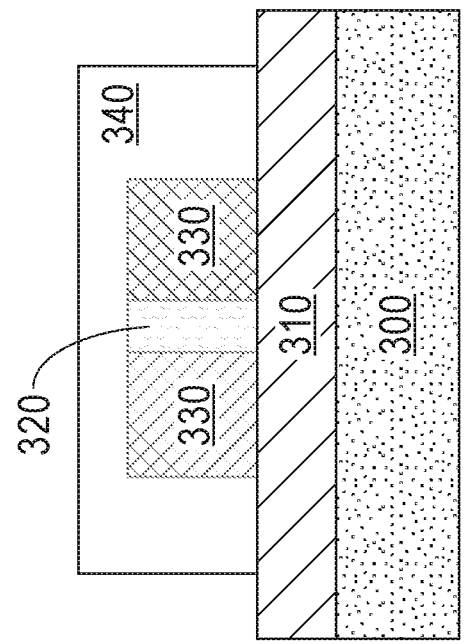
FIG. 27B depicts a cross-sectional view of section X1" of the semiconductor structure after fabrication steps of selectively removing mandrel material and first spacer material not covered by the cut masking layer, in accordance with an embodiment of the present invention.
Figure 27A:
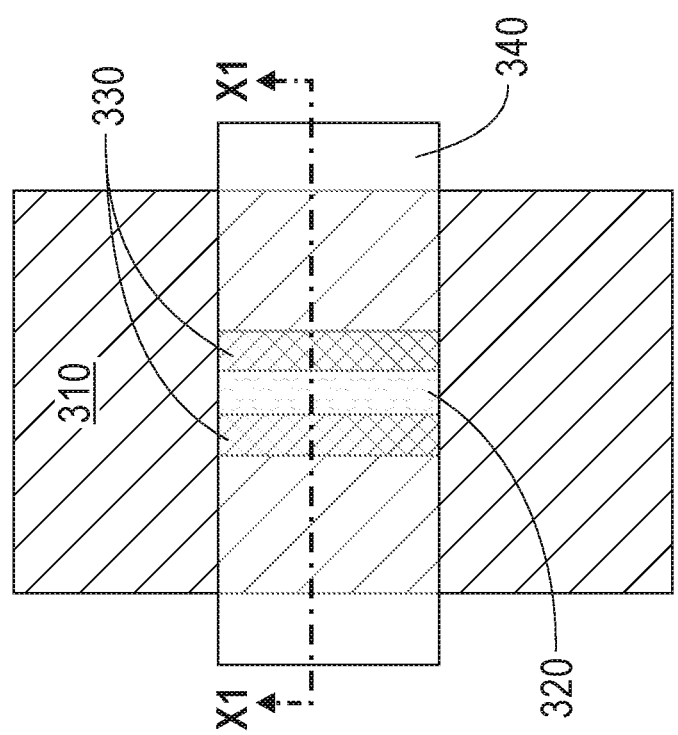
FIG. 27A depicts a top view of a semiconductor structure after fabrication steps of selectively removing mandrel material and first spacer material not covered by the cut masking layer illustrating locations of section X1", in accordance with an embodiment of the present invention.

FIG. 27A depicts a top view of a semiconductor structure after fabrication steps of selectively removing mandrel material 320 and first spacer material 330 not covered by the cut masking layer 340 illustrating locations of section X1", in accordance with an embodiment of the present invention. In embodiments of the present invention, mandrel material 320 and first spacer material 330 not covered by the cut masking layer 340 is removed using selective etching processes known in the art. In an embodiment, mandrel material 320 may comprise silicon germanium (SiGe) and may be removed using an aqueous solution containing ammonia and hydroperoxide. In an alternative embodiments, mandrel material 320 may comprise silicon germanium (SiGe) and may be removed using a gas phase hydrogen chloride (HCl.) In an embodiment of the present invention, mandrel material and first spacer material 330 not covered by cut masking layer 340 may be removed using reactive-ion etching. FIG. 27B depicts a cross-sectional view of section X1" of the semiconductor structure after fabrication steps of selectively removing mandrel material 320 and first spacer material 330 not covered by the cut masking layer 340, in accordance with an embodiment of the present invention. In various embodiment of this invention, a selective reactive-ion etch or plasma etch can be used to remove materials not covered by cut masking layer 340. In various embodiment of this invention, multiple etch processes can be used in combination to selective remove materials not covered by the cut masking layer 340.

Figure 28B:
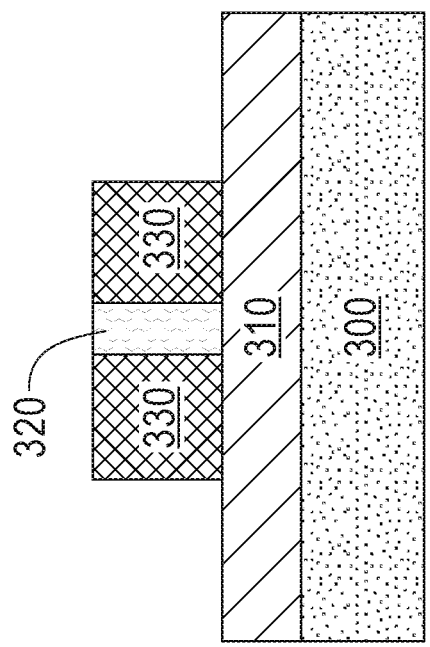
FIG. 28B depicts a cross-sectional view of section X1" of the semiconductor structure after fabrication steps of removing the cut masking layer, in accordance with an embodiment of the present invention.
Figure 28A:
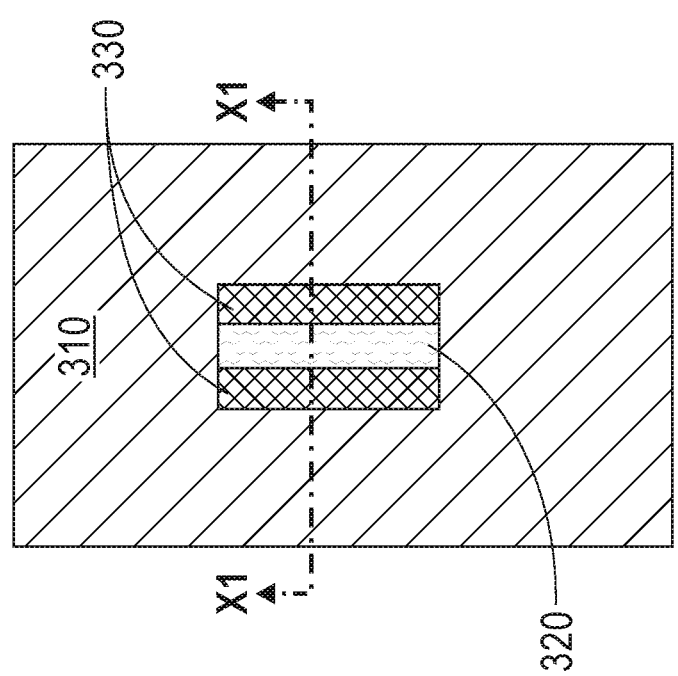
FIG. 28A depicts a top view of a semiconductor structure after fabrication steps of removing the cut masking layer illustrating locations of section X1", in accordance with an embodiment of the present invention.

FIG. 28A depicts a top view of a semiconductor structure after fabrication steps of removing the cut masking layer 340 illustrating locations of section X1", in accordance with an embodiment of the present invention. In embodiments of the invention, cut masking layer 340, when made as a photoresist layer, may be removed using an ashing process (e.g., oxygen plasma process). In alternative embodiments, cut masking layer 340 may be removed using any known process in the art such as a suitable etching process based on the type of cut masking layer 340. FIG. 28B depicts a cross-sectional view of section X1" of the semiconductor structure after fabrication steps of removing the cut masking layer 340, in accordance with an embodiment of the present invention.

FIG. 29A depicts a top view of a semiconductor structure after fabrication steps of forming a second spacer material 350 on top of the pad layer 310 and around the mandrel material 320 and the first spacer material 330 illustrating locations of section X1", in accordance with an embodiment of the present invention. In various embodiments of the present invention, second spacer material 350 (e.g., $SiO_2$, SiON, SiN, SiBCN, SiOCN, SiOC, etc.) is deposited with a lateral width similar to the lateral width of first spacer material 330. In various embodiments, reactive-ion etching is used to form second spacer material 350 to have a substantially similar height to both mandrel material 320 and the first spacer material 330. In various embodiment of the present invention, as shown in FIG. 29A, second spacer material 350 has a substantially similar lateral width in both the X direction and the Y direction. FIG. 29B depicts a cross-sectional view of section X1" of the semiconductor structure after fabrication steps of depositing a second spacer material 350 on top of the pad layer 310 and around the mandrel material 320 and the first spacer material 330, in accordance with an embodiment of the present invention.

Figure 30B:
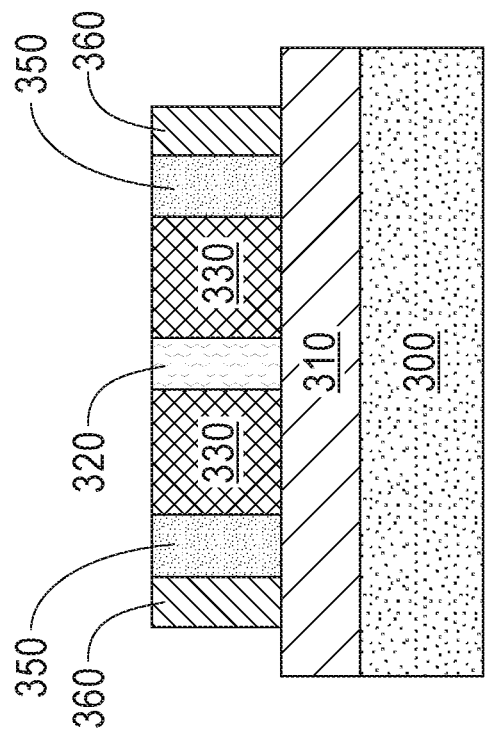
FIG. 30B depicts a cross-sectional view of section X1" of the semiconductor structure after fabrication steps of depositing a third spacer material on top of the pad layer and around the mandrel material, the first spacer material, and the second spacer material, in accordance with an embodiment of the present invention.
Figure 30A:
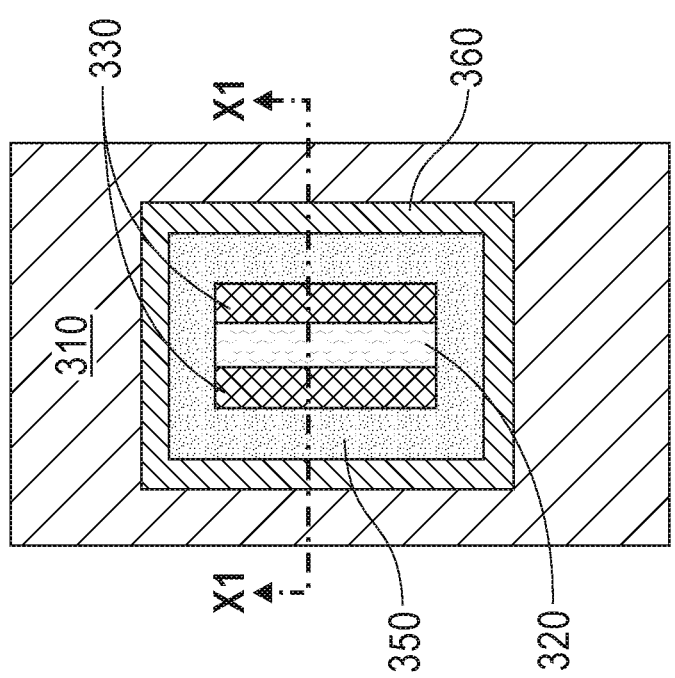
FIG. 30A depicts a top view of a semiconductor structure after fabrication steps of depositing a third spacer material on top of the pad layer and around the mandrel material, the first spacer material, and the second spacer material illustrating locations of section X1", in accordance with an embodiment of the present invention.

FIG. 30A depicts a top view of a semiconductor structure after fabrication steps of depositing a third spacer material 360 on top of the pad layer 310 and around the mandrel material 320, the first spacer material 330, and the second spacer material 350 illustrating locations of section X1", in accordance with an embodiment of the present invention. In various embodiments of the present invention, third spacer material 360 (e.g., $SiO_2$, SiON, SiN, SiBCN, SiOCN, SiOC, etc.) is deposited with a lateral width similar to the lateral width of first spacer material 330 and second spacer material 360. In various embodiment of the present invention, as shown in FIG. 30A, third spacer material 360 has a substantially similar lateral width in both the X direction and the Y direction. FIG. 30B depicts a cross-sectional view of section X1" of the semiconductor structure after fabrication steps of depositing a third spacer material 360 on top of the pad layer 310 and around the mandrel material 320, the first spacer material 330, and the second spacer material 350, in accordance with an embodiment of the present invention.

Figure 31B:
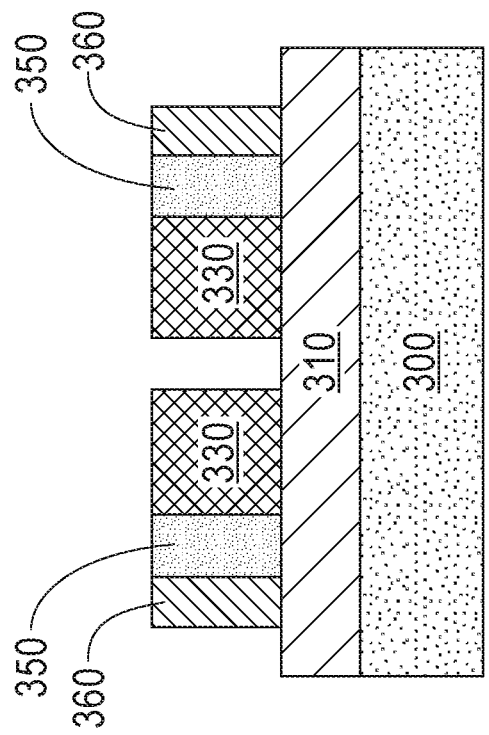
FIG. 31B depicts a cross-sectional view of section X1" of the semiconductor structure after fabrication steps of selectively etching to remove the mandrel material, in accordance with an embodiment of the present invention.
Figure 31A:
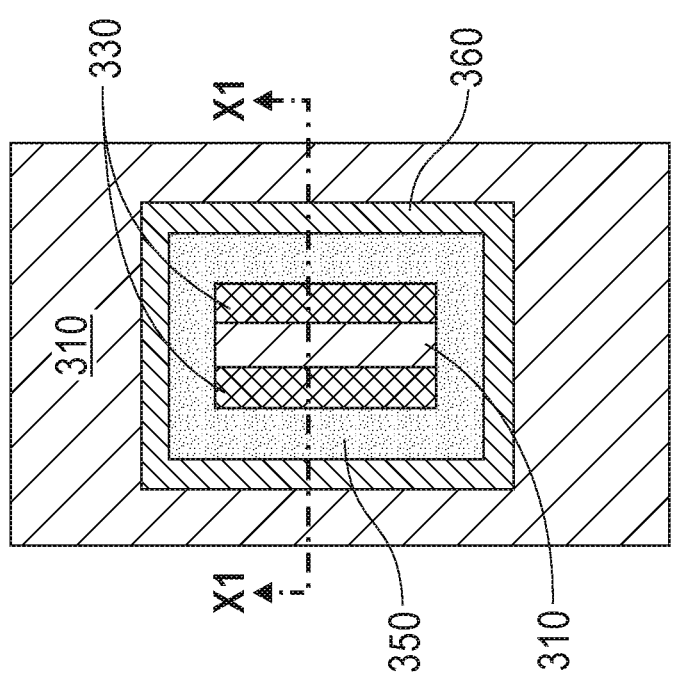
FIG. 31A depicts a top view of a semiconductor structure after fabrication steps of selectively etching to remove the mandrel material illustrating locations of section X1", in accordance with an embodiment of the present invention.

FIG. 31A depicts a top view of a semiconductor structure after fabrication steps of selectively etching to remove the mandrel material 320 illustrating locations of section X1", in accordance with an embodiment of the present invention. In embodiments of the present invention, reactive-ion etching is used to remove mandrel material 320 and expose the pad layer 310 beneath. FIG. 31B depicts a cross-sectional view of section X1" of the semiconductor structure after fabrication steps of selectively etching to remove the mandrel material 320, in accordance with an embodiment of the present invention.

FIG. 32A depicts a top view of a semiconductor structure after fabrication steps of selectively etching to remove the second spacer material 350 illustrating locations of section X1", in accordance with an embodiment of the present invention. In embodiments of the present invention, reactive-ion etching is used to remove the second spacer material 350 and expose the pad layer 310 beneath. As shown in FIG. 32A, upon removal of the second spacer material 350, each portion of second spacer material 350 is in a "c shape". FIG. 32B depicts a cross-sectional view of section X1" of the semiconductor structure after fabrication steps of selectively etching to remove the second spacer material 350, in accordance with an embodiment of the present invention.

Figure 33A:
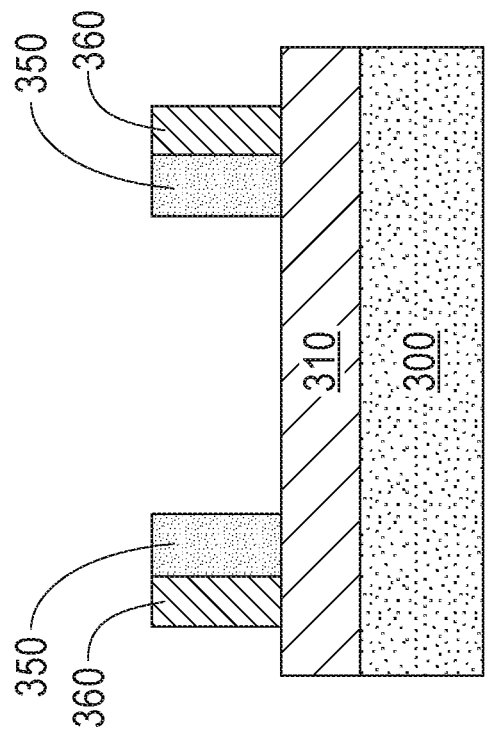
FIG. 33A depicts a top view of a semiconductor structure after fabrication steps of selectively etching to remove the first spacer material illustrating locations of section X1", in accordance with an embodiment of the present invention.
Figure 33B:
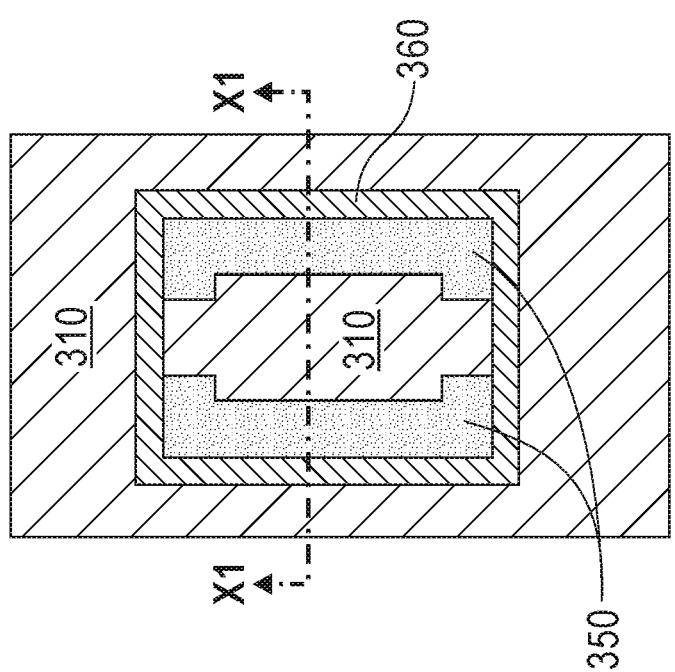
FIG. 33B depicts a cross-sectional view of section X1" of the semiconductor structure after fabrication steps of selectively etching to remove the first spacer material, in accordance with an embodiment of the present invention.

FIG. 33A depicts a top view of a semiconductor structure after fabrication steps of selectively etching to remove the first spacer material 330 illustrating locations of section X1", in accordance with an embodiment of the present invention. In embodiments of the present invention, wet etching using ammonia is used to remove the first spacer material 330 and expose the pad layer 310 beneath. FIG. 33B depicts a cross-sectional view of section X1" of the semiconductor structure after fabrication steps of selectively etching to remove the first spacer material 330, in accordance with an embodiment of the present invention.

Figure 34B:
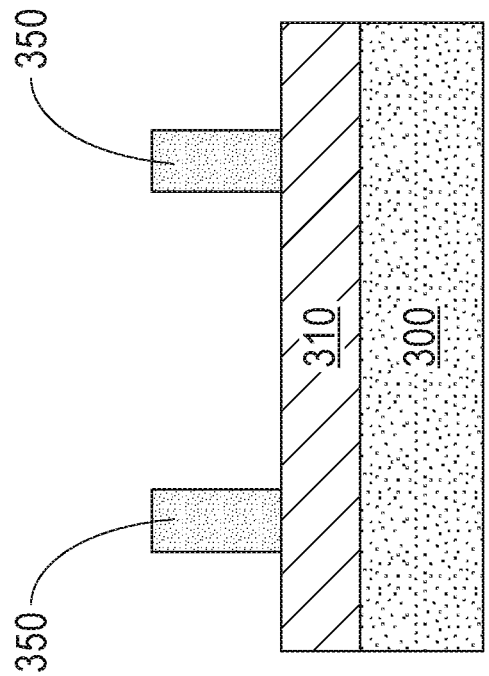
FIG. 34B depicts a cross-sectional view of section X1" of the semiconductor structure after fabrication steps of selectively etching to remove the third spacer material, in accordance with an embodiment of the present invention.
Figure 34A:
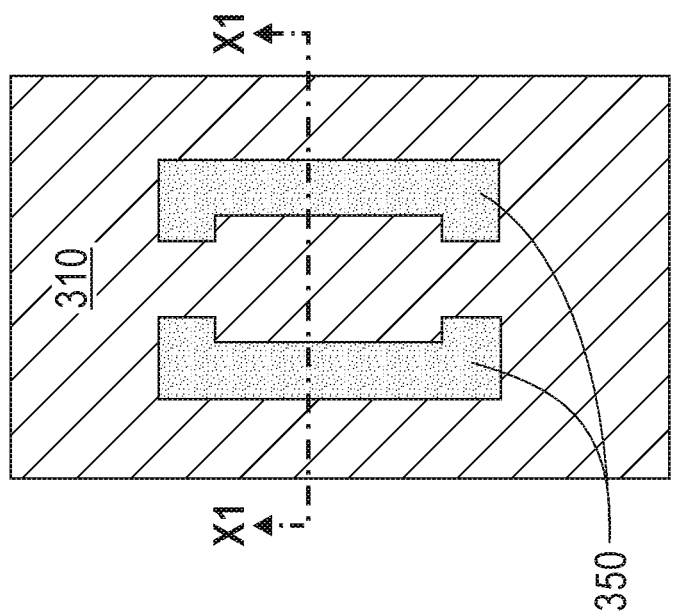
FIG. 34A depicts a top view of a semiconductor structure after fabrication steps of selectively etching to remove the third spacer material illustrating locations of section X1", in accordance with an embodiment of the present invention.

FIG. 34A depicts a top view of a semiconductor structure after fabrication steps of selectively etching to remove the third spacer material 360 illustrating locations of section X1", in accordance with an embodiment of the present invention. In embodiments of the present invention, hot phosphoric etching or SiN plasma etching is used to remove the third spacer material 330 and expose the pad layer 310 beneath. FIG. 34B depicts a cross-sectional view of section X1" of the semiconductor structure after fabrication steps of selectively etching to remove the third spacer material 360, in accordance with an embodiment of the present invention.

Figure 35B:
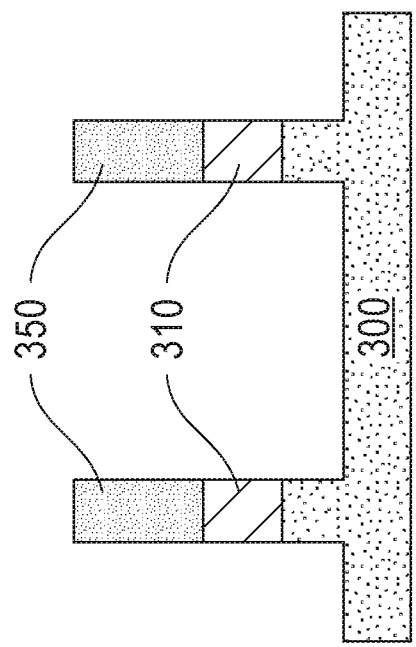
FIG. 35B depicts a cross-sectional view of section X1" of the semiconductor structure after fabrication steps of transferring the pattern into the pad layer and semiconductor structure, in accordance with an embodiment of the present invention.
Figure 35A:
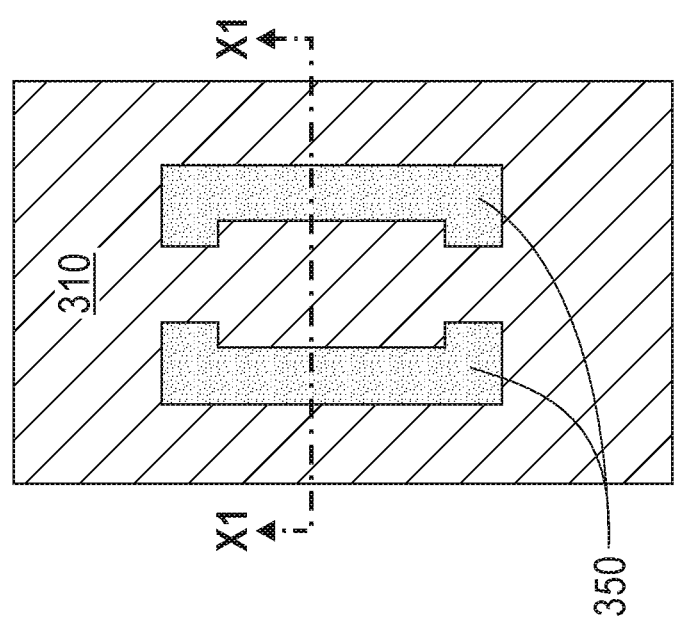
FIG. 35A depicts a top view of a semiconductor structure after fabrication steps of transferring the pattern into the pad layer and semiconductor structure illustrating locations of section X1", in accordance with an embodiment of the present invention.

FIG. 35A depicts a top view of a semiconductor structure after fabrication steps of transferring the pattern into the pad layer and semiconductor structure illustrating locations of section X1", in accordance with an embodiment of the present invention. In various embodiments, the pattern formed by the remaining second spacer material 350 is transferred into the pad layer 310 and semiconductor substrate 300 using reactive-ion etching to form the fins. FIG. 35B depicts a cross-sectional view of section X1" of the semiconductor structure after fabrication steps of transferring the pattern into the pad layer 310 and semiconductor structure 300, in accordance with an embodiment of the present invention. In various embodiments of the present invention, third second spacer material 350 and pad layer 310 may be removed (not shown) using any suitable process known in the art.

What is claimed is:

1. A method of forming a semiconductor structure, the method comprising:
    forming a first mask layer in a first direction on top of a semiconductor substrate;
    forming two or more mandrel material patterned perpendicular to the first direction of the first mask layer;
    forming a second mask layer on one or more exposed surfaces of the two or more mandrel material;
    forming a cut masking layer on top of and in contact with at least a portion of the two or more mandrel material, at least a portion of the second mask layer, and at least a portion of the first mask layer;
    selectively removing the two or more mandrel material and the second mask layer not covered by the cut masking layer;
    removing the cut masking layer;
    removing the two or more mandrel material; and
    transferring a pattern of the first mask layer and the second mask layer into the semiconductor substrate.

2. The method of claim 1, wherein a width of the first mask layer is between 5 nanometers (nm) and 20 nm and wherein the first mask layer is selected from the group consisting of silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), siliconboron carbonitride (SiBCN), silicon oxycarbonitride (SiOCN), silicon oxide, titanium nitride (TiN).

3. The method of claim 1, wherein the two or more mandrel material is between 10 nm and 50 nm in thickness and wherein the two or more mandrel material is selected from the group consisting of amorphous silicon (aSi), polycrystalline silicon, amorphous silicon germanium (aSiGe), and polycrystalline silicon germanium.

4. The method of claim 1, wherein the second mask layer on top of the two or more mandrel material is selectively removed using reactive-ion etching.

5. The method of claim 1, wherein the two or more mandrel material and the second mask layer not covered by the cut masking layer are selectively removed using reactive-ion etching.

6. The method of claim 1, wherein the two or more mandrel material comprises silicon germanium and the mandrel material is selectively removed using an aqueous solution containing ammonia and hydroperoxide.

7. The method of claim 1, wherein the pattern is selected from the group consisting of a "+" fin, an "H" fin, a 3 pair fin, or a 4 pair fin.

* * * * *